(12) United States Patent
Iwaya et al.

(10) Patent No.: US 6,452,266 B1
(45) Date of Patent: Sep. 17, 2002

(54) SEMICONDUCTOR DEVICE

(75) Inventors: Akihiko Iwaya, Tokyo (JP); Toshio Sugano, Kodaira (JP); Susumu Hatano, Higashimurayama (JP); Yutaka Kagaya, Higashimurayama (JP); Masachika Masuda, Tokorozawa (JP)

(73) Assignees: Hitachi, Ltd., Tokyo (JP); Akita Electronics Co., Ltd., Akita (JP)

(*) Notice: Subject to any disclaimer, the term of this patent is extended or adjusted under 35 U.S.C. 154(b) by 0 days.

(21) Appl. No.: 10/024,011

(22) Filed: Dec. 21, 2001

Related U.S. Application Data

(63) Continuation of application No. 09/563,455, filed on May 3, 2000, now Pat. No. 6,388,318.

(30) Foreign Application Priority Data

May 6, 1999 (JP) ............................................ 11-125909

(51) Int. Cl.[7] .............................................. H01L 21/44
(52) U.S. Cl. ........................ 257/723; 257/724; 257/780
(58) Field of Search ................................ 257/723, 724, 257/780, 779, 784, 736, 750

(56) References Cited

U.S. PATENT DOCUMENTS 5,691,570 A * 11/1997 Kozuka ........................ 257/693
5,966,630 A    10/1999 Yoshiyama
6,121,681 A     9/2000 Tanaka et al.

FOREIGN PATENT DOCUMENTS

| JP | 10-256474 | 9/1998 |
| JP | 11-17099  | 1/1999 |

* cited by examiner

Primary Examiner—David L. Talbott
Assistant Examiner—Luan Thai
(74) Attorney, Agent, or Firm—Mattingly, Stanger & Malur, P.C.

(57) ABSTRACT

A semiconductor device capable of improving the flexibility of designing electrical lead patterns for connection from chips via a substrate to external terminals by appropriately arranging the substrate structure and layout of more than one address signal as commonly shared by four separate chips is disclosed. In a surface mount type package of ball grid array (BGA), four chips 1 are mounted on a substrate 2 in such a manner such these are laid out in the form of an array of two rows and two columns. These four chips 1 are such that regarding the upper side and lower side, these are in linear symmetry with respect to a center line extending in a direction along long side edges of the substrate 2. Each chip 1 has a plurality of pads 9 which are disposed thereon into an almost linear array substantially along the center line in the direction of short side edges, which pads include addressing pads 9a that are located on the side of central part on a specified plane of the substrate 2, and control-use pads 9b of control signals that are also placed on the center side of the substrate 2. The pad array also includes input/output pads 9c that are disposed so that these are on the peripheral side on the surface of substrate 2.

1 Claim, 28 Drawing Sheets

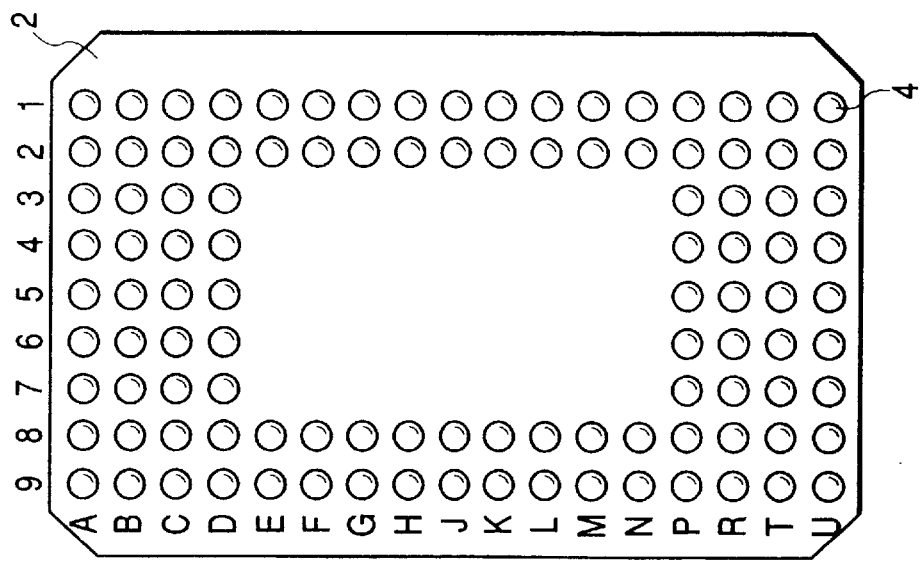
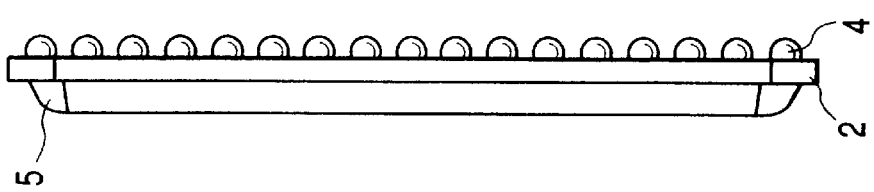
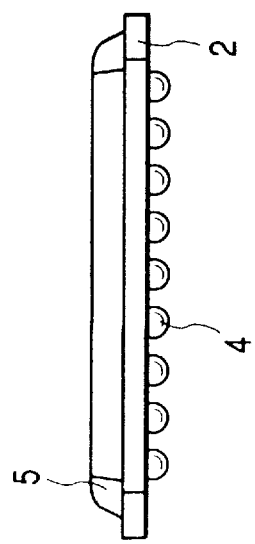

○ : THROUGH-HOLES (10)

2 (1ST & 4TH LAYERS)

FIG. 16

| PAD NO. | PAD NAMES | USE |
|---|---|---|
| 1 | VSSI | POWER SUPPLY |
| 2 | VBB | P-TEST |
| 3 | VPLT | P-TEST |
| 4 | VPP | P-TEST |
| 5 | VDDI | POWER SUPPLY |
| 6 | VDD | POWER SUPPLY |
| 7 | VSS | POWER SUPPLY |
| 8 | BOP1B | BONDING OPTION |
| 9 | BOP2B | BONDING OPTION |
| 10 | A3 | INPUT (ADDRESS) |
| 11 | A4 | INPUT (ADDRESS) |
| 12 | A2 | INPUT (ADDRESS) |
| 13 | A5 | INPUT (ADDRESS) |
| 14 | A1 | INPUT (ADDRESS) |
| 15 | A6 | INPUT (ADDRESS) |
| 16 | A0 | INPUT (ADDRESS) |
| 17 | A7 | INPUT (ADDRESS) |
| 18 | A10 | INPUT (ADDRESS) |
| 19 | A8 | INPUT (ADDRESS) |
| 20 | A12 | INPUT (ADDRESS) |
| 21 | A9 | INPUT (ADDRESS) |
| 22 | VSS | POWER SUPPLY |
| 23 | VDD | POWER SUPPLY |
| 24 | A13 | INPUT (ADDRESS) |
| 25 | A11 | INPUT (ADDRESS) |
| 26 | /CS | INPUT (CONTROL) |
| 27 | CKE | INPUT (CONTROL) |
| 28 | /RAS | INPUT (CONTROL) |
| 29 | CLK | INPUT (CONTROL) |
| 30 | /CAS | INPUT (CONTROL) |
| 31 | DQMU | INPUT (CONTROL) |
| 32 | /WE | INPUT (CONTROL) |
| 33 | VREF | INPUT (CONTROL) |
| 34 | DQML | INPUT (CONTROL) |
| 35 | VSSI | POWER SUPPLY |
| 36 | VSS | POWER SUPPLY |
|   | CHIP CENTER |   |

| PAD NO. | PAD NAMES | USE |
|---|---|---|
| 37 | VDD | POWER SUPPLY |
| 38 | VDDI | POWER SUPPLY |
| 39 | DQ8 | I/O DATA |
| 40 | DQ7 | I/O DATA |
| 41 | VDDQ | POWER SUPPLY |
| 42 | VSSQ | POWER SUPPLY |
| 43 | DQ9 | I/O DATA |
| 44 | DQ6 | I/O DATA |
| 45 | DQ10 | I/O DATA |
| 46 | DQ5 | I/O DATA |
| 47 | VSSQ | POWER SUPPLY |
| 48 | VDDQ | POWER SUPPLY |
| 49 | DQ11 | I/O DATA |
| 50 | DQ4 | I/O DATA |
| 51 | VSS | POWER SUPPLY |
| 52 | VDD | POWER SUPPLY |
| 53 | DQ12 | I/O DATA |
| 54 | DQ3 | I/O DATA |
| 55 | VDDQ | POWER SUPPLY |
| 56 | VSSQ | POWER SUPPLY |
| 57 | DQ13 | I/O DATA |
| 58 | DQ2 | I/O DATA |
| 59 | DQ14 | I/O DATA |
| 60 | DQ1 | I/O DATA |
| 61 | VSSQ | POWER SUPPLY |
| 62 | VDDQ | POWER SUPPLY |
| 63 | DQ15 | I/O DATA |
| 64 | DQ0 | I/O DATA |
| 65 | VSS | POWER SUPPLY |
| 66 | BOP0B | BONDING OPTION |
| 67 | VDD | POWER SUPPLY |
| 68 | VDDIU | POWER SUPPLY |
| 69 | VPERI | P-TEST |
| 70 | VDL | P-TEST |
| 71 | VBLR | P-TEST |
| 72 | VSSIU | POWER SUPPLY |
|   | CHIP CENTER |   |

FIG. 17

| SUBSTRATE PAD NO. | CHIP PAD NAMES ×16 | CHIP PAD NAMES ×8 | SUBSTRATE PAD NO. | CHIP PAD NAMES ×16 | CHIP PAD NAMES ×8 |
|---|---|---|---|---|---|
| 1 | VSS | VSS | 29 | VDD | VDD |
| 1 | VSS | VSS | 29 | VDD | VDD |
| 1 | BOP2B | — | 30 | A3 | A3 |
| 1 | — | BOP1B | 31 | A2 | A2 |
| 2 | A4 | A4 | 32 | A1 | A1 |
| 3 | A5 | A5 | 33 | A0 | A0 |
| 4 | A6 | A6 | 34 | A10 | A10 |
| 5 | A7 | A7 | 35 | A9 | A9 |
| 6 | A8 | A8 | 36 | VDD | VDD |
| 7 | A12 | A12 | 37 | A13 | A13 |
| 8 | VSS | VSS | 38 | /CS | /CS |
| 9 | A11 | A11 | 39 | /RAS | /RAS |
| 10 | CKE | CKE | 40 | /CAS | /CAS |
| 11 | CLK | CLK | 41 | DQMU | DQM |
| 12 | /WE | /WE | 42 | DQML | — |
| 13 | VREF | VREF | 43 | VDD | VDD |
| 14 | VSS | VSS | 43 | VDD | VDD |
| 14 | VSS | VSS | 44 | DQ7 | — |
| 15 | DQ8 | — | 45 | VDD | VDD |
| 16 | VSS | VSS | 46 | DQ6 | DQ3 |
| 17 | DQ9 | DQ4 | 47 | DQ5 | — |
| 18 | DQ10 | — | 48 | VDD | VDD |
| 19 | VSS | VSS | 49 | DQ4 | DQ2 |
| 20 | DQ11 | DQ5 | 50 | VDD | VDD |
| 21 | VSS | VSS | 51 | DQ3 | — |
| 22 | DQ12 | — | 52 | VDD | VDD |
| 23 | VSS | VSS | 53 | DQ2 | DQ1 |
| 24 | DQ13 | DQ6 | 54 | DQ1 | — |
| 25 | DQ14 | — | 55 | VDD | VDD |
| 26 | VSS | VSS | 56 | DQ0 | DQ0 |
| 27 | DQ15 | DQ7 | 57 | VDD | VDD |
| 28 | VSS | VSS | 57 | VDD | VDD |
| 28 | VSS | VSS | | | |

— : NC

SEMICONDUCTOR DEVICE

This is a continuation application of U.S. Ser. No. 09/563,455 filed May 3, 2000 now U.S. Pat. No. 6,388,318.

FIELD OF THE INVENTION

The present invention relates in general to semiconductor device packaging architectures and, in more particular, to techniques adaptable for effective use in large capacity accommodatable semiconductor devices with a plurality of chips mounted together in a single package structure.

BACKGROUND OF THE INVENTION

Investigation made by the inventors as named herein has revealed that currently available techniques for achieving increased storage capacities in modern memory package structures with multiple chips mound together in a single package may include, but not limited to, a scheme for stacking or laminating a plurality of chips in a direction along the thickness of a package, and a scheme for disposing a plurality of chips in a direction along a plane. Examples of the latter scheme are disclosed, for example, in Japanese Patent Laid-Open Nos. 17099/1999 and 256474/1998, wherein the techniques as taught by these Japanese printed publications are generally arranged as will be set forth below.

The prior known technique as taught by Japanese Patent Laid-Open No. 17099/1999 is directed to a package structure including a rectangular module substrate with four bare chips mounted thereon. The module substrate has a surface on which a linear array of conductive pads is formed at part near or around the central portion along the long sides thereof while letting chip pairs be mounted on the chip surface on the opposite sides of the pad array. Each bare chip is structurally designed to have bonding pads that are aligned in a linear array extending along the center line thereof, wherein these bonding pads and those pads on the module substrate are connected together by use of bonding wires with a resin material deposited to cover the bare chips and bonding wires.

The prior art technique suggested from Japanese Patent Laid-Open No. 256474/1998 is such that multiple bare chips are mounted on the top and bottom surfaces of a module substrate, each of which chips has a layout of center pads capable of permitting connection of wires extending from the chip center toward lateral directions, thereby providing a structure that uses bonding wires to electrically connect together bonding pads on each bare chip and the pads on the module substrate.

SUMMARY OF THE INVENTION

After consideration given to the above-identified Japanese documents, the inventors wish to make the following observations about the prior art approaches as taught thereby.

The prior art technique of Japanese Patent Laid-Open No. 17099/1999 is based on the fact that addressing terminals are useable in common among four separate chips while simultaneously enabling common use or "commonization" of control terminals including write-enable terminals and chip-enable terminals and the like, for disposing those on-substrate pads to be connected to these commonly useable or "commnizeable" terminals in the form of a linear array at a location in close proximity to the central part on the substrate, wherein this prior art fails to involve any specific teachings about how function assignment is done to respective on-substrate pads and to respective onchip pads.

The prior art of Japanese Patent Laid-Open No. 256474/1998 is inherently designed so that on-substrate chips coupled to common signals among a plurality of chips—such as address signals, control signals, power supply, or the like—are provided on the substrate in areas lying between adjacent ones of the chips mounted thereon to thereby provide connectivity of two bonding wires from both chips to these interchip pads, wherein this prior art is not stated about any exact schemes for assigning functions to respective on-substrate pads and also to onchip pads.

The present invention has been made in view of the need for function assignment to on-substrate/onchip pads such as the ones stated supra, and a primary object of the invention is to provide a new and improved semiconductor device capable of improving flexibilities of forming a pattern of electrical leads(wirings) used for electrical connection from chips via a substrate up to external terminals, by uniquely arranging the layout of addressing pads of those address signals as commonly used among four chips and also substrate structure and others.

The said and other objects, features and advantages of this invention will be apparent from the following more particular description of preferred embodiments of the invention, as illustrated in the accompanying drawings.

A brief summary of some representative ones of the inventions as disclosed herein will be explained below.

The present invention is adaptable for use in a semiconductor device that includes four chips each having on its surface a memory circuit and a plurality of pads including a plurality of address pads for use in inputting address signals of the memory circuit along with a plurality of input/output pads for inputting and outputting input/output data and also having a pair of long sides and a pair of short sides, a substrate supporting thereon the four chips and having on its surface a plurality of pads including address pads and input/output pads as electrically connected to respective ones of the address pads and input/output pads of the four chips, and a plurality of external terminals being electrically connected to the address pads and input/output pads on the substrate and including address terminals and input/output terminals as provided on a bottom surface of the substrate, which device offers specific features which follow.

More specifically the semiconductor device of this invention is characterized in that the four chips are disposed on the substrate in form of an array of rows and columns, the plurality of address pads of each of the four chips are disposed adjacent to one side of the pair of short sides, the plurality of input/output pads are disposed and spaced apart from one side of the pair of short sides toward the other side of the pair of short sides when compared to the plurality of address pads, one of the pair of short sides of each of the four chips is disposed adjacent to one of the pair of short sides of its neighboring chip to permit the plurality of address pads of each of the four chips are placed at central part on a plane of the substrate, corresponding pads in the plurality of address pads of each of the four chips are commonly connected together to the address terminals of the external terminals, and the plurality of input/output pads of each of the four chips are connected to the input/output terminals of the external terminals independently of one another in units of respective chips. With such an arrangement, it becomes possible to improve the degree of freedom or flexibility in arranging electrical wiring leads in connection between the pads on each chip and the external terminals.

In this arrangement, in order to further improve the lead wiring flexibility, the device is featured in that the substrate is of a polygonal shape having a pair of long sides and a pair of short sides, the substrate has a multilayered wiring lead structure with electrical leads of a plurality of layers, the four chips are laid out into a matrix of two rows in a direction along the short sides of the substrate and two columns in a long side direction, address pads of chips laid out in the short side direction of the substrate are electrically connected together by a first lead layer extending in the short side direction of the substrate, and address pads of chips laid out in the long side direction of the substrate are electrically connected together by a second lead layer being different from the first lead layer and extending in the long side direction of the substrate. This first lead layer is an uppermost layer among the plurality of lead layers of the substrate whereas the second lead layer is a lowermost layer among the plurality of lead layers of the substrate, wherein the first lead layer and the second lead layer are electrically connected together by more than one through-hole filled with a conductive material as formed in the substrate; further, the external terminals have lands used for connection of solder balls, the second lead layer is the same in level as the lands of the external terminals, and all of the lands of the external terminals are disposed on a bottom surface of the substrate in an area outside of the second lead layer.

Furthermore, in regard to the layout of the external terminals at the substrate, in order to create modules, the substrate is arranged in form of a rectangular shape, wherein the address terminals of the external terminals are laid out at central part of a pair of long sides of this substrate of rectangular shape, while letting the input/output terminals of the external terminals be disposed at corner portions of the substrate. Moreover, more than one control pad for use in inputting a control signal of the memory circuit is further provided on each chip, one of each pair of short sides of the four chips is disposed adjacent to a corresponding one of its neighboring chip to permit each control pad on each chip to be placed on a center side on the plane of the substrate, each control pad is commonized and connected to a control terminal of the external terminals, and the control terminal is disposed at central part of a long side of the substrate.

In addition, regarding each chip, for purposes of enabling common use or "commonization" of address signals, the pads on each chip are laid out into a linear array along a long side direction of each chip at central part thereof; or alternatively, the pads on each chip are laid out along the pair of long sides of each chip.

In addition, regarding the pads on the substrate, for purposes-of readily performing wire bonding, the pads on each chip are disposed along outside of the pair of long sides of each chip.

With regard to practically implementable package structure, each chip is mounted on the substrate via a die-bonding material, the pads on each chip are connected by bonding wires to the pads on the substrate, each chip mounted on the substrate and the bonding wires are structurally arranged to be molded by a resin material, and the substrate is provided with a penetration hole for permitting escape of moisture vapor occurring due to thermal processing during solder reflow processes, wherein a step-like surface configuration correcting member made of a dielectric material is disposed at peripheral part of the penetration hole of the substrate while letting the die-bonding material be prevented from being disposed at the periphery of the penetration hole of the substrate.

Regarding other possible practical package structure, each chip is mounted on the substrate by a face-down structure, and each chip and the substrate are coupled together by flip chip bonding techniques using metallic balls to have a structure with a resin material filled between a surface of each chip and the substrate.

This invention also provides another semiconductor device which is featured in that four chips are disposed in a linear symmetrical fashion on the substrate in form of an array of rows and columns, the plurality of address pads of each of the four chips are disposed adjacent to one side of the pair of short sides, the plurality of input/output pads are disposed and spaced apart from one side of the pair of short sides toward the other side of the pair of short sides when compared to the plurality of address pads, one of the pair of short sides of each of the four chips is disposed adjacent to one of the pair of short sides of its neighboring chip to permit the plurality of address pads of each of the four chips are placed at central part on a plane of the substrate, corresponding pads in the plurality of address pads of each of the four chips are commonly connected together to the address terminals of the external terminals, and the plurality of input/output pads of each of the four chips are connected to the input/output terminals of the external terminals independently of one another in units of respective chips. With such an arrangement, it is possible by using the linear-symmetrical chip layout to attain commonization of address signals while at the same time improving the flexibility in wiring leads in connection between pads on each chip and the external terminals.

The invention also provides yet another semiconductor device which is featured in that four chips are each such that the input/output pads are of ×16 input/output bit configuration, corresponding pads in respective plurality of address pads of each of the four chips are connected in common to the address terminals of the external terminals, and the plurality of input/output pads of each of the four chips are connected to said input/output terminals of the external terminals in a way independent per each chip and are thus caused by the four chips to have ×64 input/output bit configuration. With such an arrangement, it is possible by using four chips of ×16 input/output bit configuration to make up the intended package with ×64 input/output bit configuration.

Further, as per each chip and the substrate, for the purpose of arranging the package with either ×64 or ×32 input/output bit configuration, the four chips are each designed to have an option-use pad with a bonding option function capable of permitting the input/output bit configuration to switch between ×16 and ×8, wherein the substrate has an option-use pad with a bonding option function capable of letting the input/output bit configuration switch between ×16 and ×8, switching between the option-use pad on each said chip and the option-use pad on the substrate allows each of the four chips to exhibit either ×16- or ×8-input/output bit configurations, and ×64- or ×32-input/output bit configurations is established by the four chips.

Additionally, the semiconductor device incorporating the principles of the invention should not be limited only to the memory circuit, and a further semiconductor device may be provided which includes specified circuitry, a chip having on its surface a plurality of pads for use in inputting and outputting respective signals of the circuitry, and a substrate having on its surface a plurality of pads being electrically connected to the pads on the chip respectively, and a plurality of external terminals as electrically connected to the pads on the substrate respectively, characterized in that the pads on the chip and the pads on the substrate are structurally arranged so that they are connected together by bonding wires, that first bonding is performed to the pads on the substrate, and that second bonding is done to the pads on the chip. This may be effective when improving distance margins between chips and bonding wires while suppressing the height of bonding wires.

Furthermore, as per the on-chip pads, in order to prevent damages to chips, metal balls are preformed at the pads on the chip, and the second bonding is applied to part overlying the metal balls.

BRIEF DESCRIPTION OF THE DRAWINGS

FIGS. 2A to 2C are diagrams showing a front view, side view and bottom view of the semiconductor device shown in the embodiment 1 of the invention.

FIG. 16 is a diagram for use in explaining function assignment of pads on a chip in the embodiment 1 of the invention.

FIG. 17 is a diagram for explanation of function assignment of ×16- and ×8-input/output bit configurations of pads on the substrate in the embodiment 1 of the invention.

DESCRIPTION OF THE PREFERRED EMBODIMENTS

Figure 1:
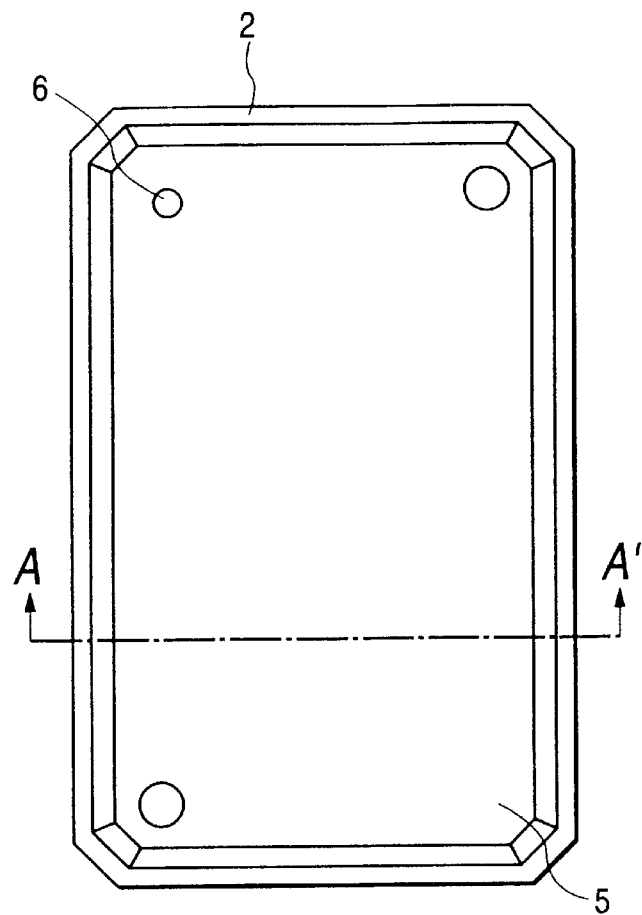
FIG. 1 is a diagram showing a plan view of a semiconductor device in accordance with an embodiment 1 of the present invention.

Some preferred embodiments of the present invention will now be described in detail with reference to the accompanying drawings below. Note that in all the drawings for use in explaining the embodiments, the same members are designated by the same reference characters with repetitive explanations thereof will be eliminated.

Embodiment 1

Figure 3:
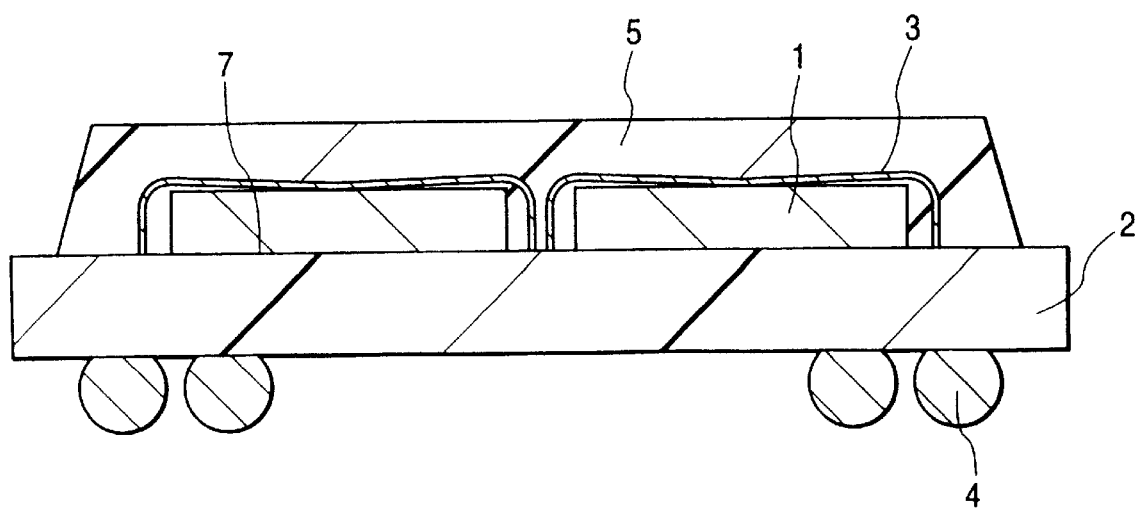
FIG. 3 is a cross-sectional view of the semiconductor device of FIG. 1 as taken along line A–A' in the embodiment 1 of the invention.
Figure 18:
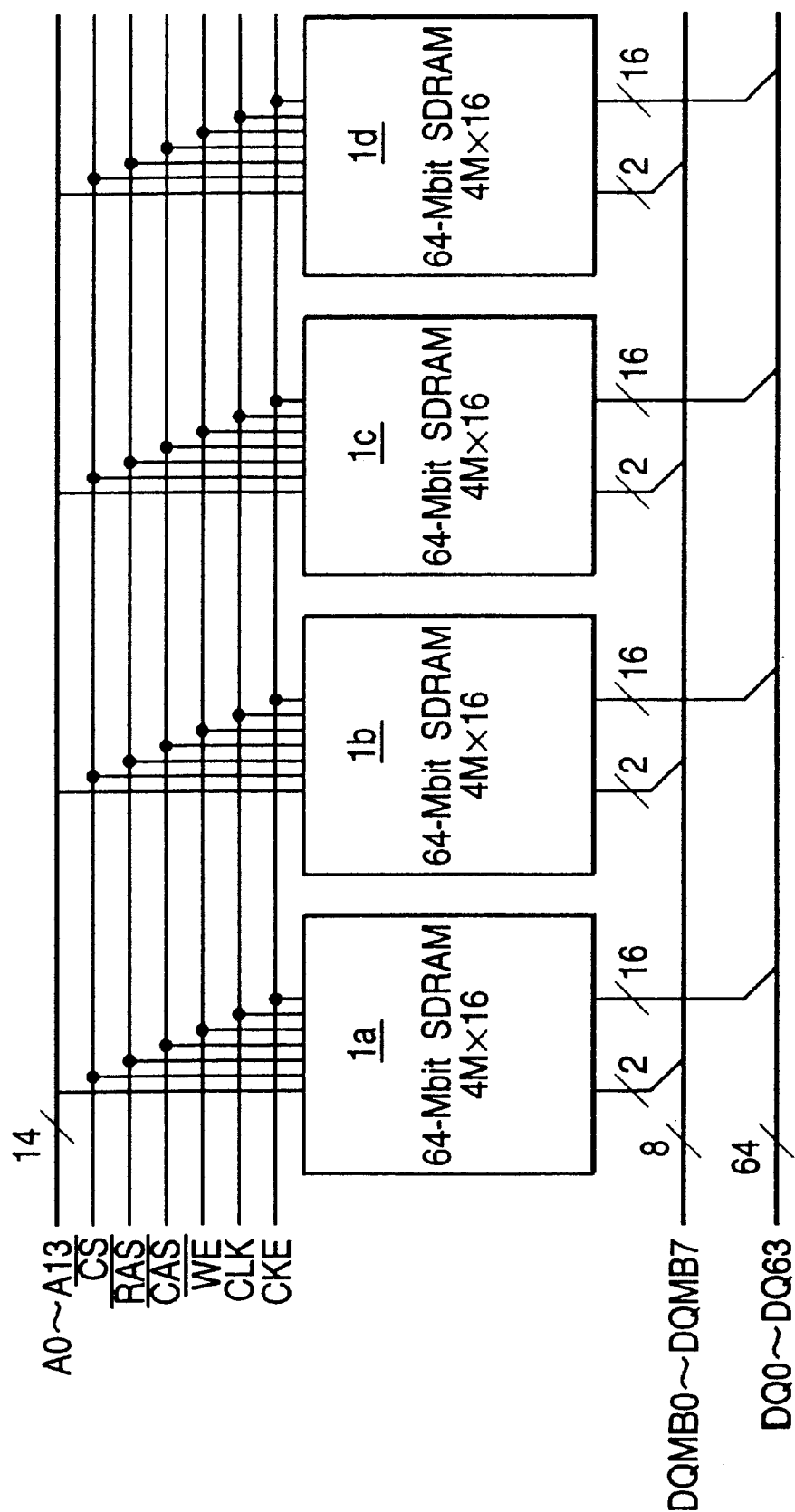
FIG. 18 is a schematical function arrangement diagram showing a ×64 (×16) input/output bit configuration of a package in the embodiment 1 of the invention.
Figure 19:
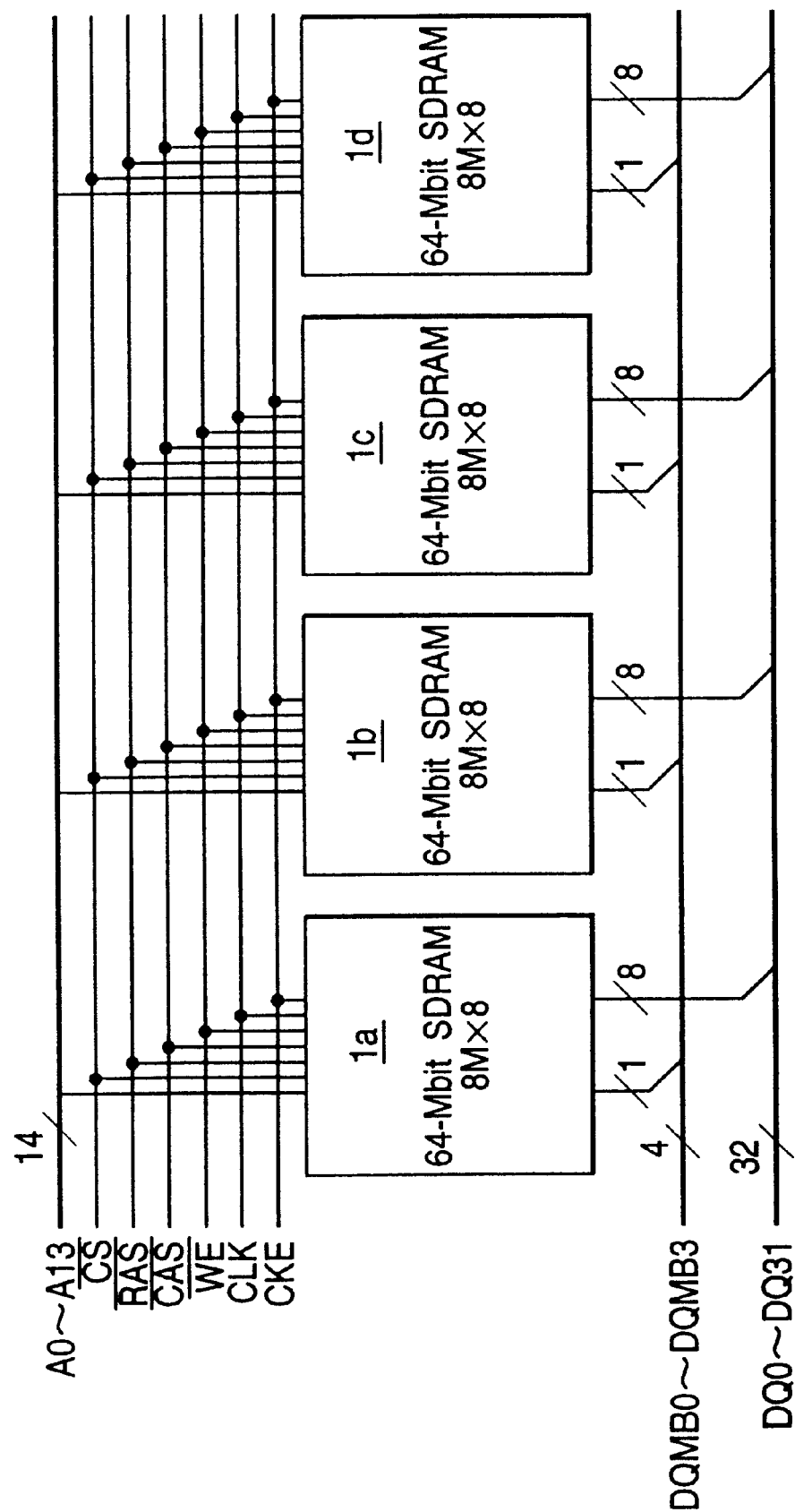
FIG. 19 is a schematical function arrangement diagram showing a ×32 (×8) input/output bit configuration of the package in the embodiment 1 of the invention.
Figure 20:
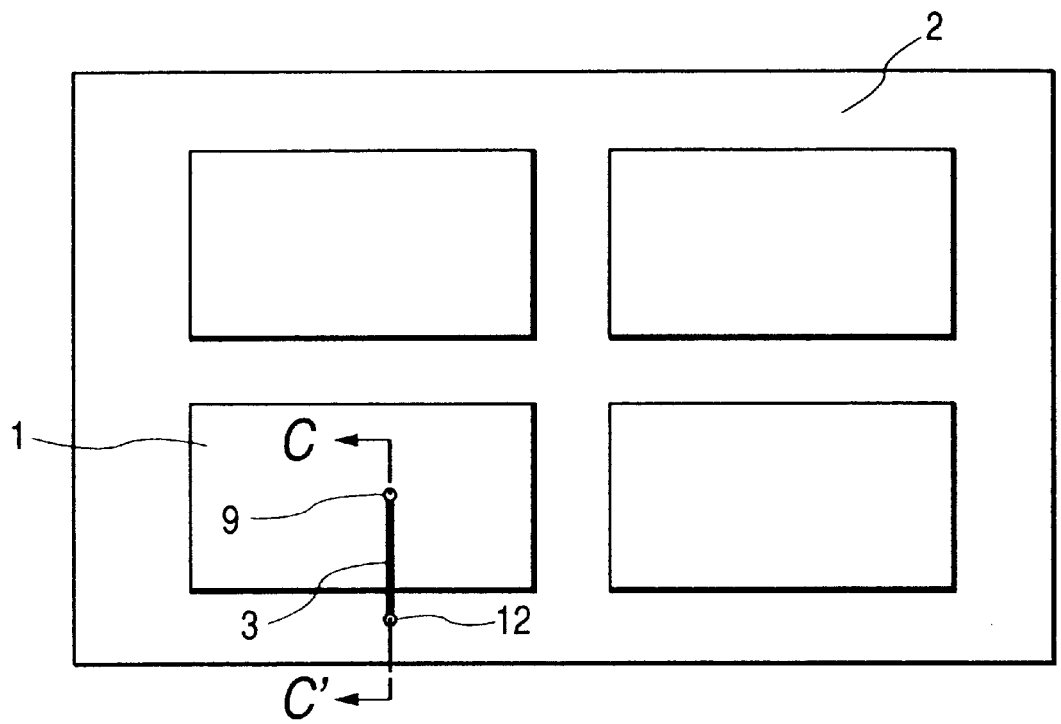
FIG. 20 is a schematical plan view diagram showing the connection state of a single wire in the embodiment 1 of the invention.
Figure 21:
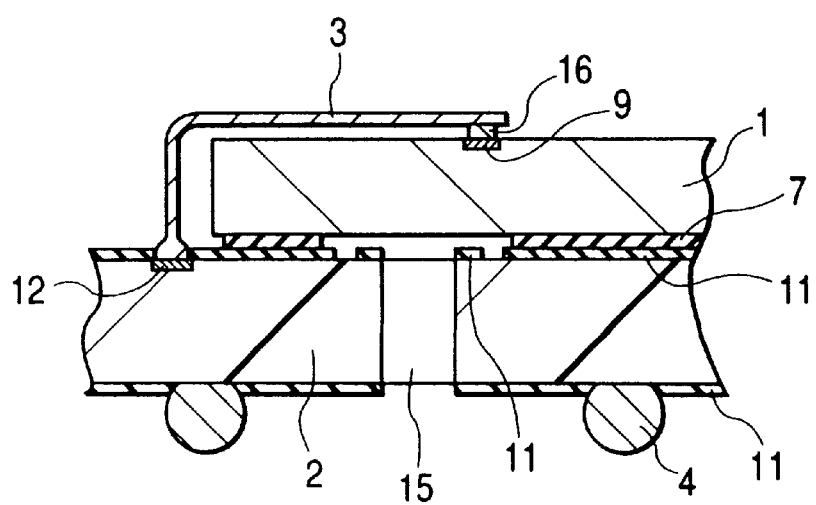
FIG. 21 is a sectional view of the structure shown in FIG. 20 taken along line C–C' in the embodiment 1 of the invention.
Figure 22:
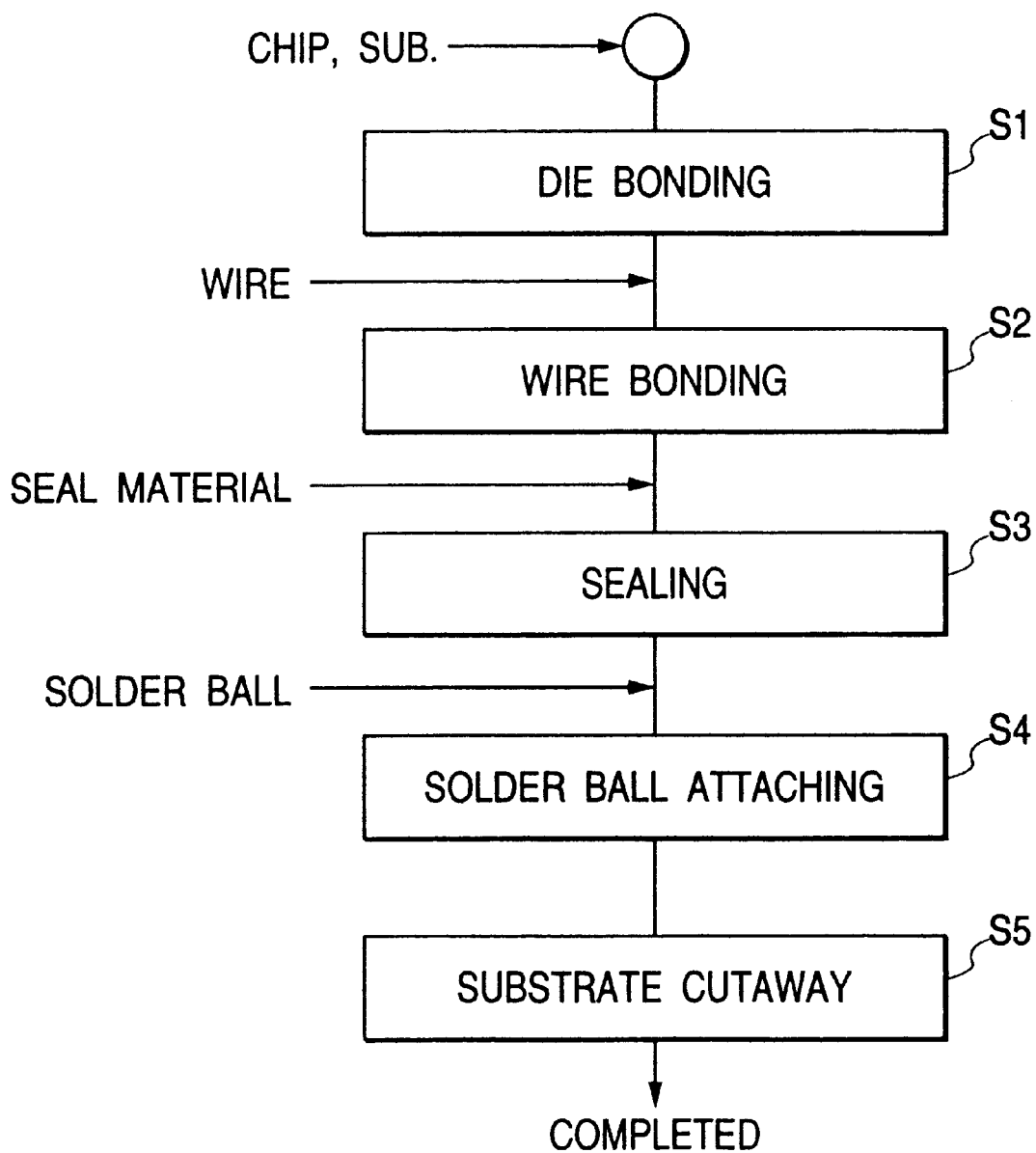
FIG. 22 is a flow diagram showing a procedure of package assembly processes in the embodiment 1 of the invention.
Figure 25:
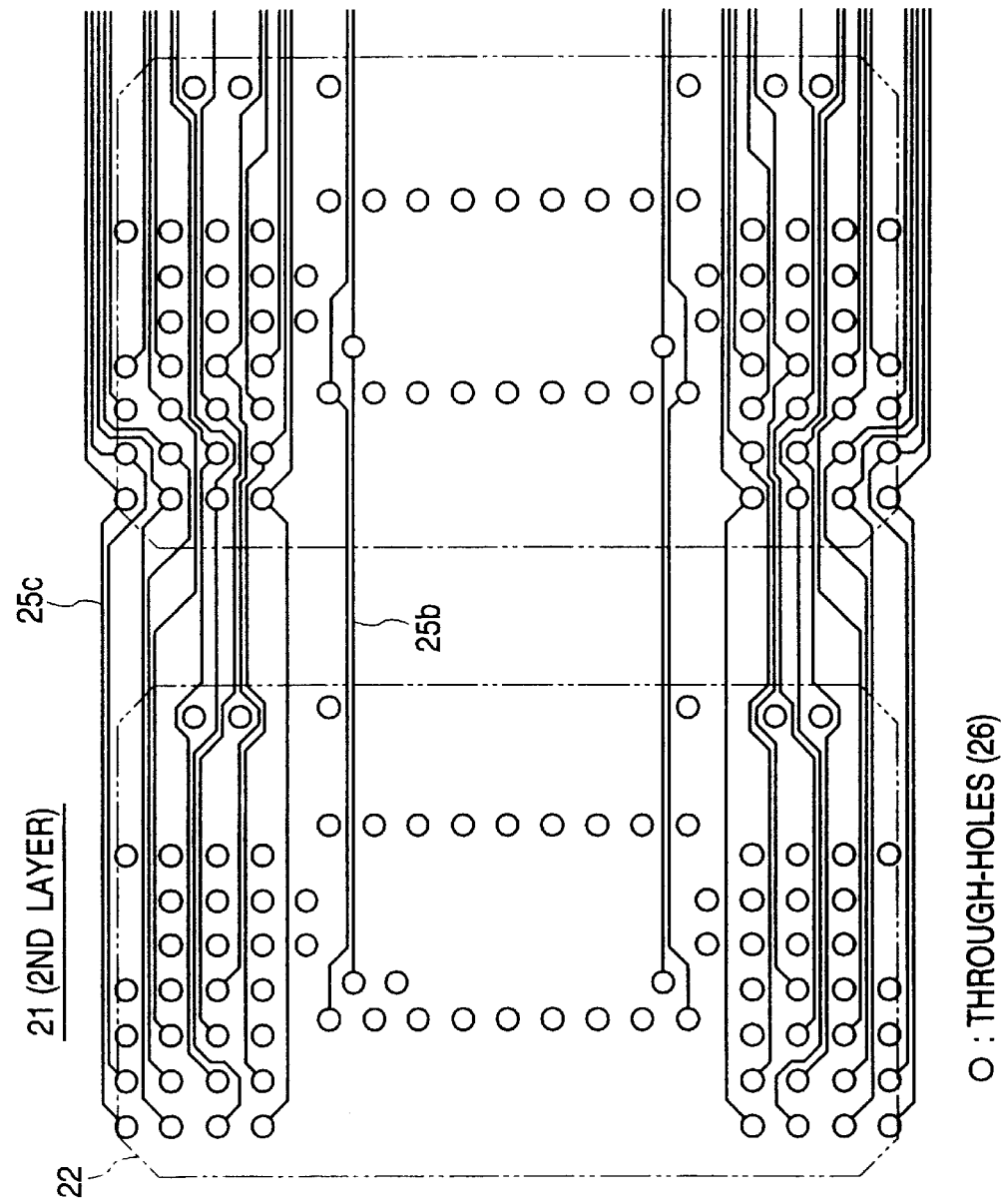
FIG. 25 is a plan view of a second-layer wiring pattern of a module substrate in the embodiment 1 of the invention.
Figure 26:
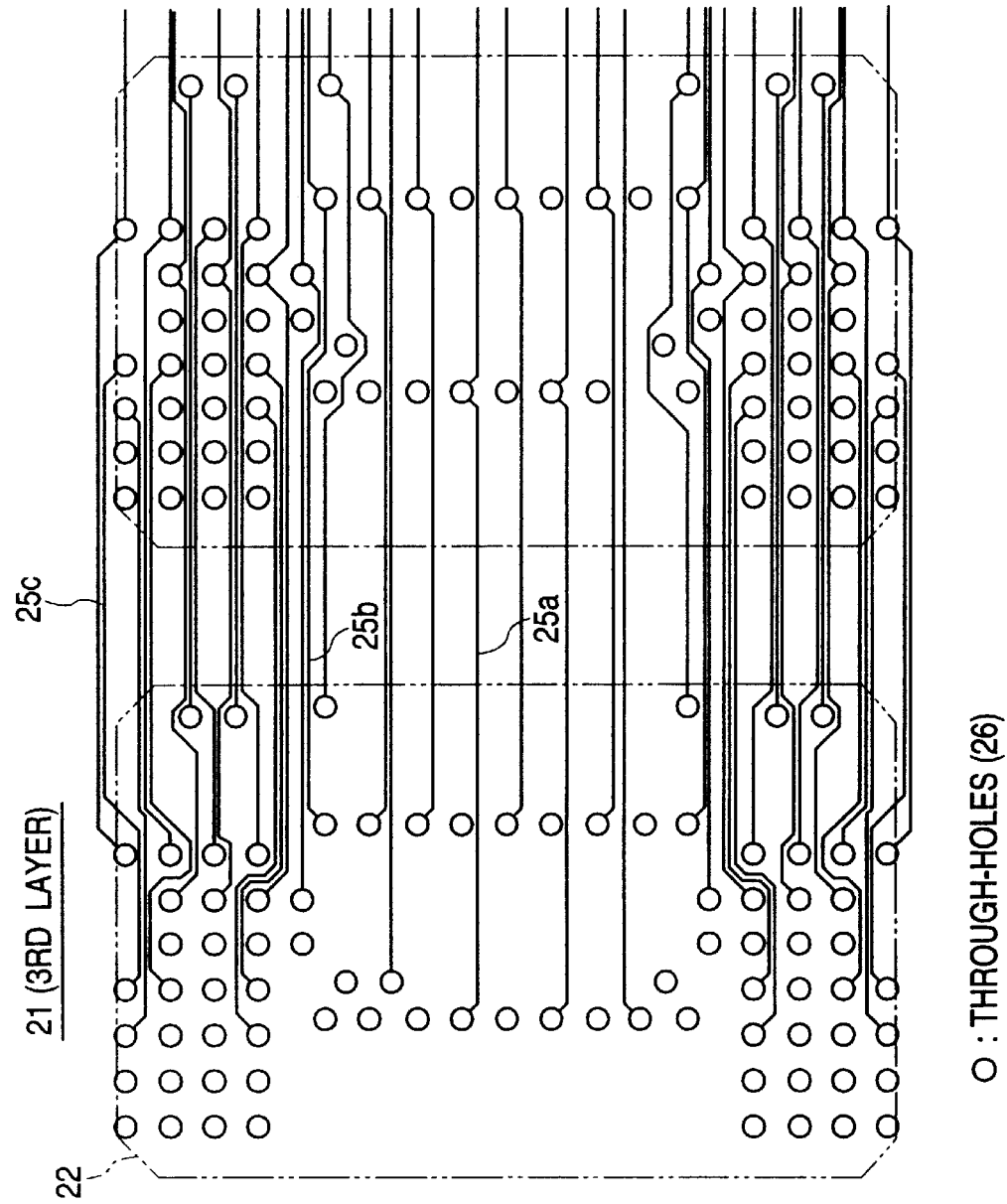
FIG. 26 is a plan view of a third-layer wiring pattern of a module substrate in the embodiment 1 of the invention.
Figure 27:
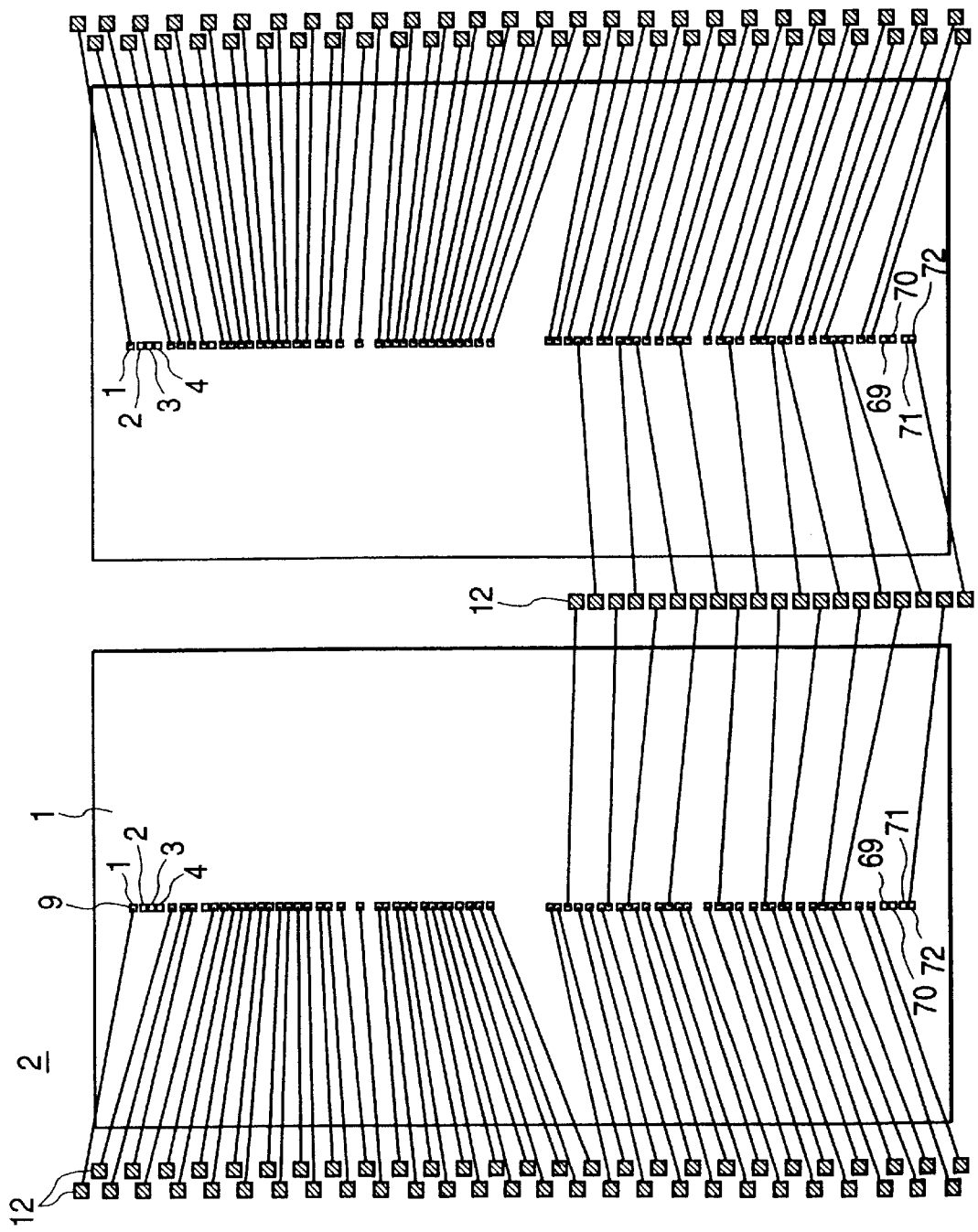
FIG. 27 is a diagram showing one modified example of the on-substrate pad layout in the embodiment 1 of the invention.
Figure 28:
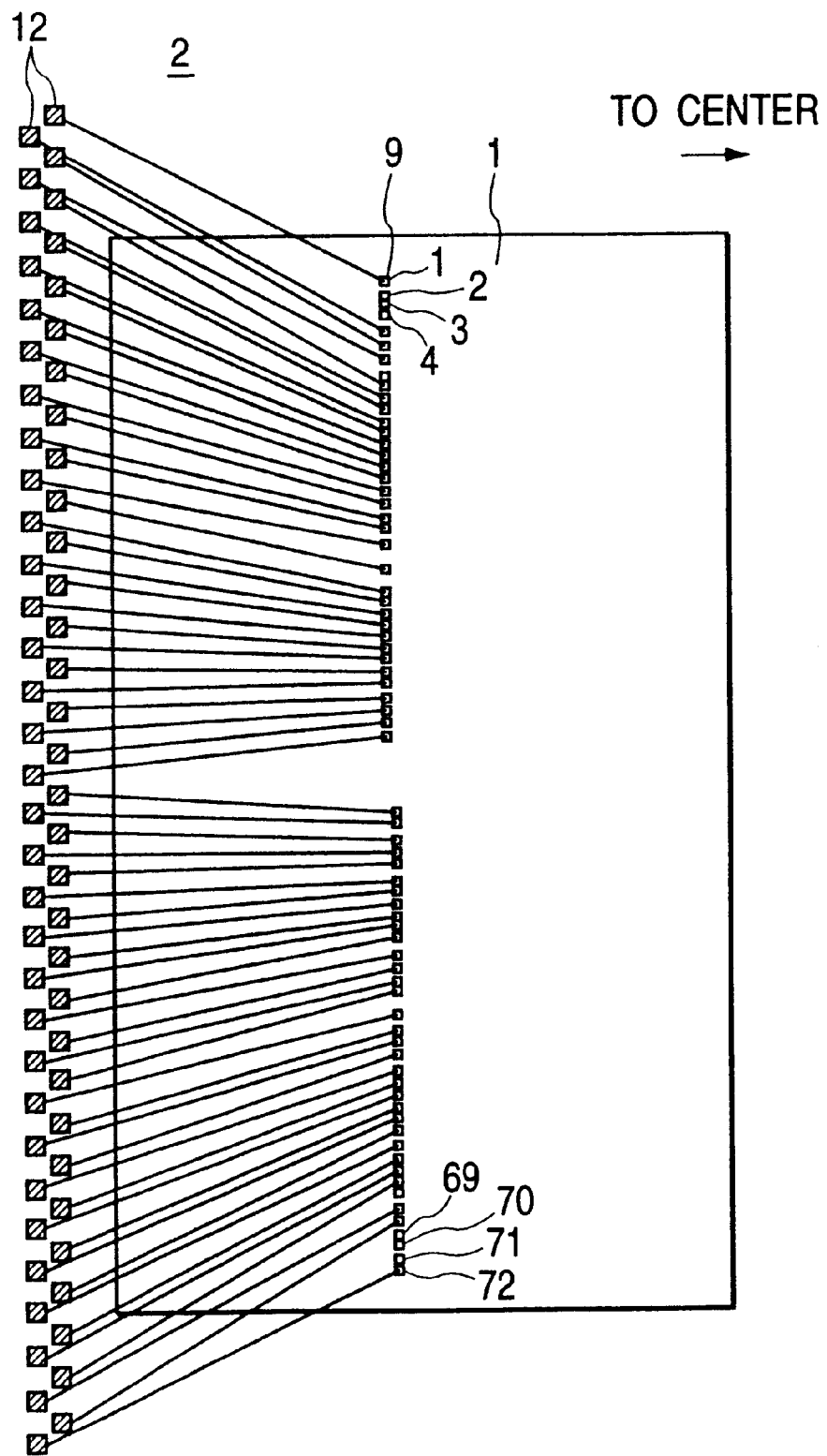
FIG. 28 is a diagram showing another modification of the on-substrate pad layout in the embodiment 1 of the invention.
Figure 29:
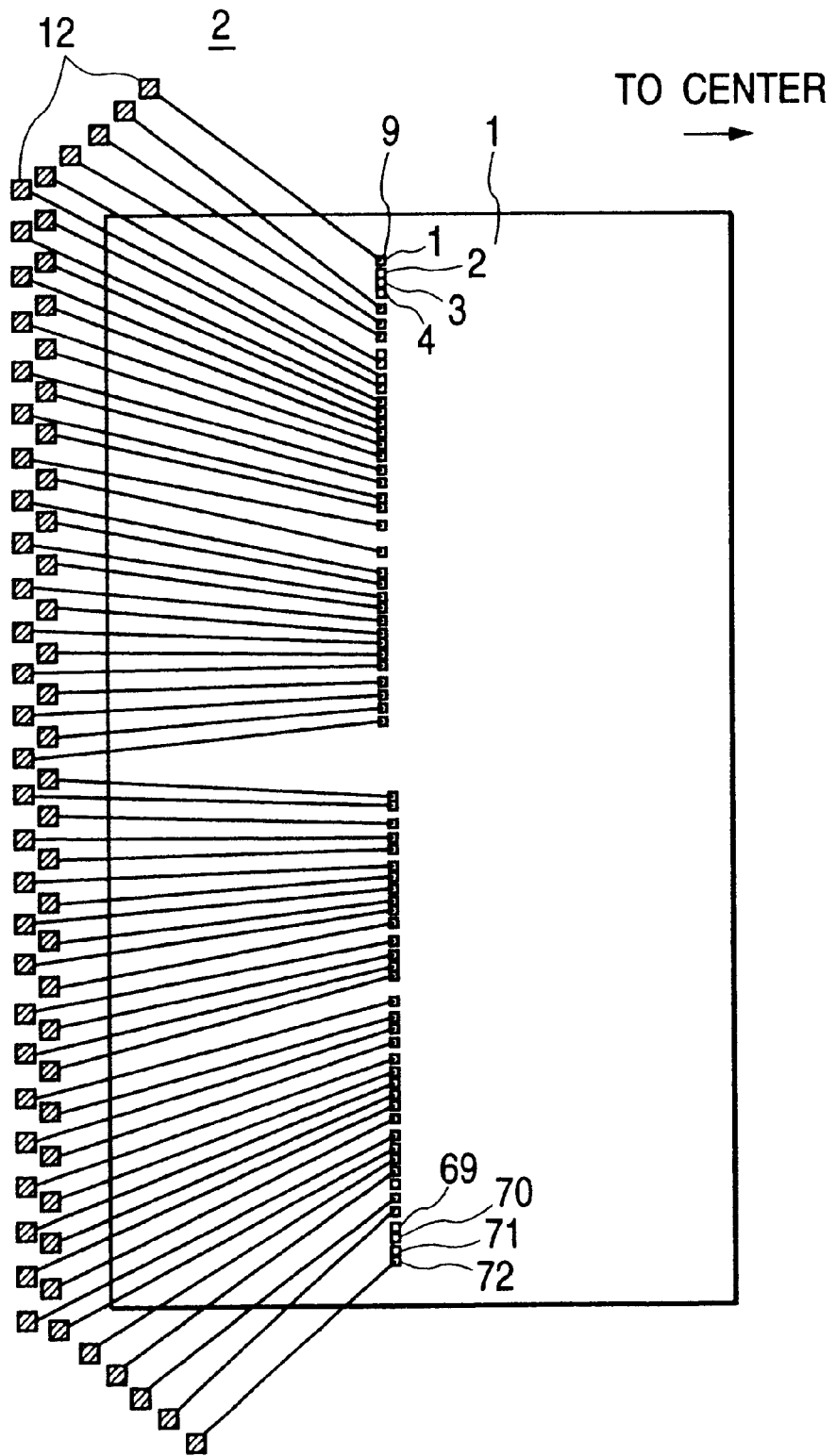
FIG. 29 is a diagram showing a further modification of the on-substrate pad layout in the embodiment 1 of the invention.

FIGS. 1 to 3 are diagrams for explanation of a general configuration of a semiconductor device in accordance with an embodiment 1 of this invention, FIGS. 4 through 12 are diagrams for detailed explanation of the structure of a substrate, FIGS. 13–19 are diagrams for detailed explanation of wire bonding between pads on chips and pads on the substrate, FIGS. 20–21 are diagrams for detailed explanation of a wire bonding structure, FIG. 22 is a flow diagram for explanation of package assembly process, FIGS. 23–26 are diagrams for explanation of a memory module, and FIGS. 27–29 are diagrams for explanation of more than one modified examples of the pad layout on the substrate.

An explanation will first be given of a schematic arrangement of one example of the semiconductor device of this invention in conjunction with FIGS. 1–3. FIG. 1 is a plan view, FIG. 2A is a front view, FIG. 2B is a side view, and FIG. 2C is a bottom view, and FIG. 3 shows a cross-sectional view as taken along line A–A' of FIG. 1.

The semiconductor device of this embodiment is designed as a surface-mount package of ball grid array (BGA) by way of example, which is constituted from four chips 1 with memory circuitry formed thereon, a substrate 2 mounting thereon these four chips 1, wires 3 used for connection between pads on this substrate 2 and pads on the chips 1, solder balls (bump electrodes) 4 as provided on a bottom or back surface of the substrate 2, a sealing material 5 for use in molding the chips 1 mounted on the substrate 2 and also the wires 3, and others. As shown in FIG. 1, this package is added with a marking 6 at one corner edge on the surface thereof.

A respective one of the four chips 1 is arranged so that a memory circuit of synchronous dynamic random access memory (SDRAM), for example, is provided thereon along with a plurality of pads that are provided on a surface for electrical connection to this memory circuit. Respective pads on each chip 1 are with specific function assignment as will be described below with reference to FIG. 16.

The substrate 2 is designed to have a multilayered lead structure of four layers, each of which is made of a glass epoxy material with a metallic thin film—such as copper (Cu)—coated thereon by way of example, wherein a chip 1 is mounted on its surface with a die-bonding material 7—such as for example epoxy resin—laid therebetween, and wherein a plurality of pads is provided on the surface, the pads being electrically connected via wires 3 to respective pads on this chip 1 respectively. Respective pads on this surface are electrically connected to lands on the back substrate surface for connection of solder balls, by way of a lead pattern on each layer and through-holes penetrating each layer and being filled with conductive materials. Respective layers of the substrate 2 are with specific function assignment as shown later in FIG. 5. Respective pads on the substrate 2 and others are with function assignment as will be described later in the description in conjunction with FIGS. 6–9 and 17.

The wires 3 are formed of metal lines (bonding wires) made of gold (Au) for example, for causing the pads on the substrate 2 to be electrically connected to the pads on each chip 1.

The solder balls 4 are external terminals of the package which are made of for example plumbum/stannum (Pb/Sn), wherein a plurality of solder balls 4 being electrically connected to respective lands that are disposed on the back surface of the substrate 2 is provided on the back surface of the substrate 2. Respective solder balls 4 are with function assignment as will be set forth later in conjunction with FIGS. 11–12.

The sealing material 5 is made of a resin material such as epoxy resin for example; this seal material 5 is for covering electrical exposure portions such as the chips 1 mounted on the substrate 2 and the wires 3 for molding, resulting in a BGA surface- mount type package structure.

Figure 4:
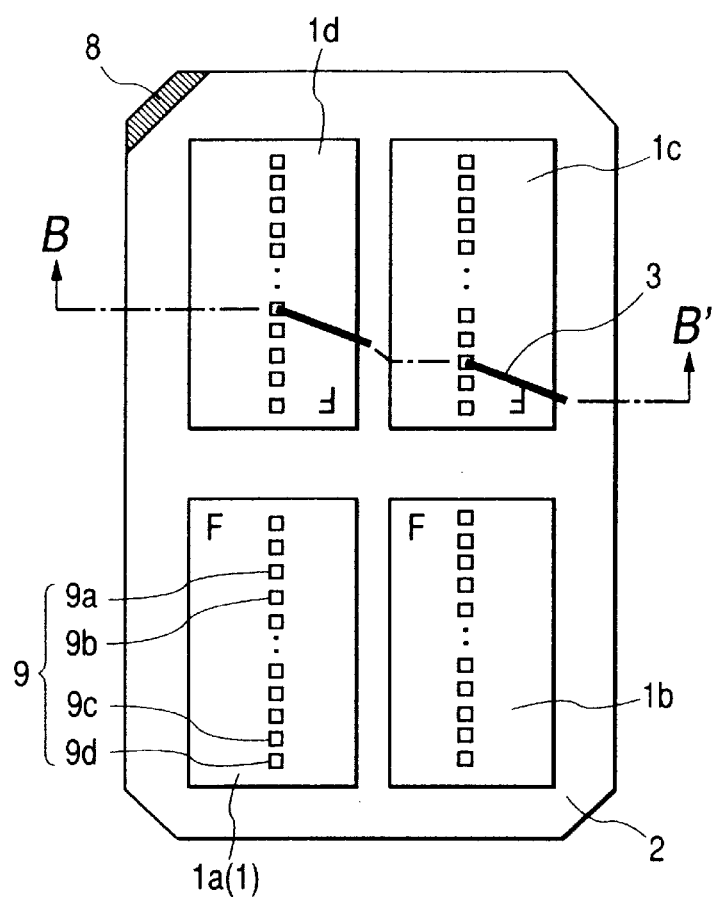
FIG. 4 is a diagram schematically showing a plan view of a structure including a substrate mounting chips thereon in accordance with the embodiment 1 of this invention (a sealing material is not shown).
Figure 5:
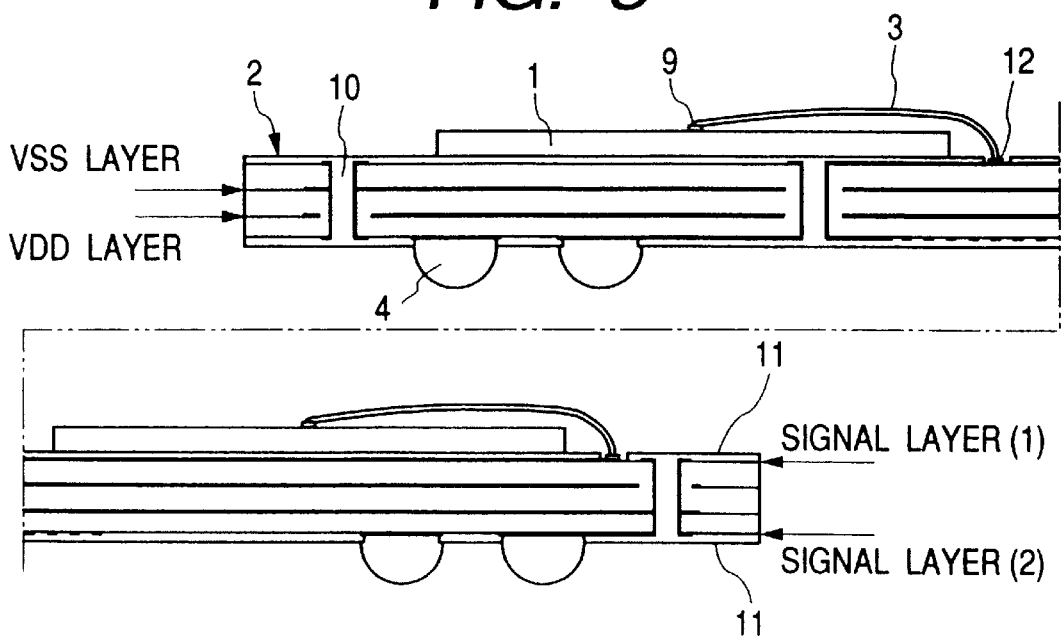
FIG. 5 is a sectional view of the device of FIG. 4 along line B–B' in the embodiment 1 of the invention.
Figure 6:
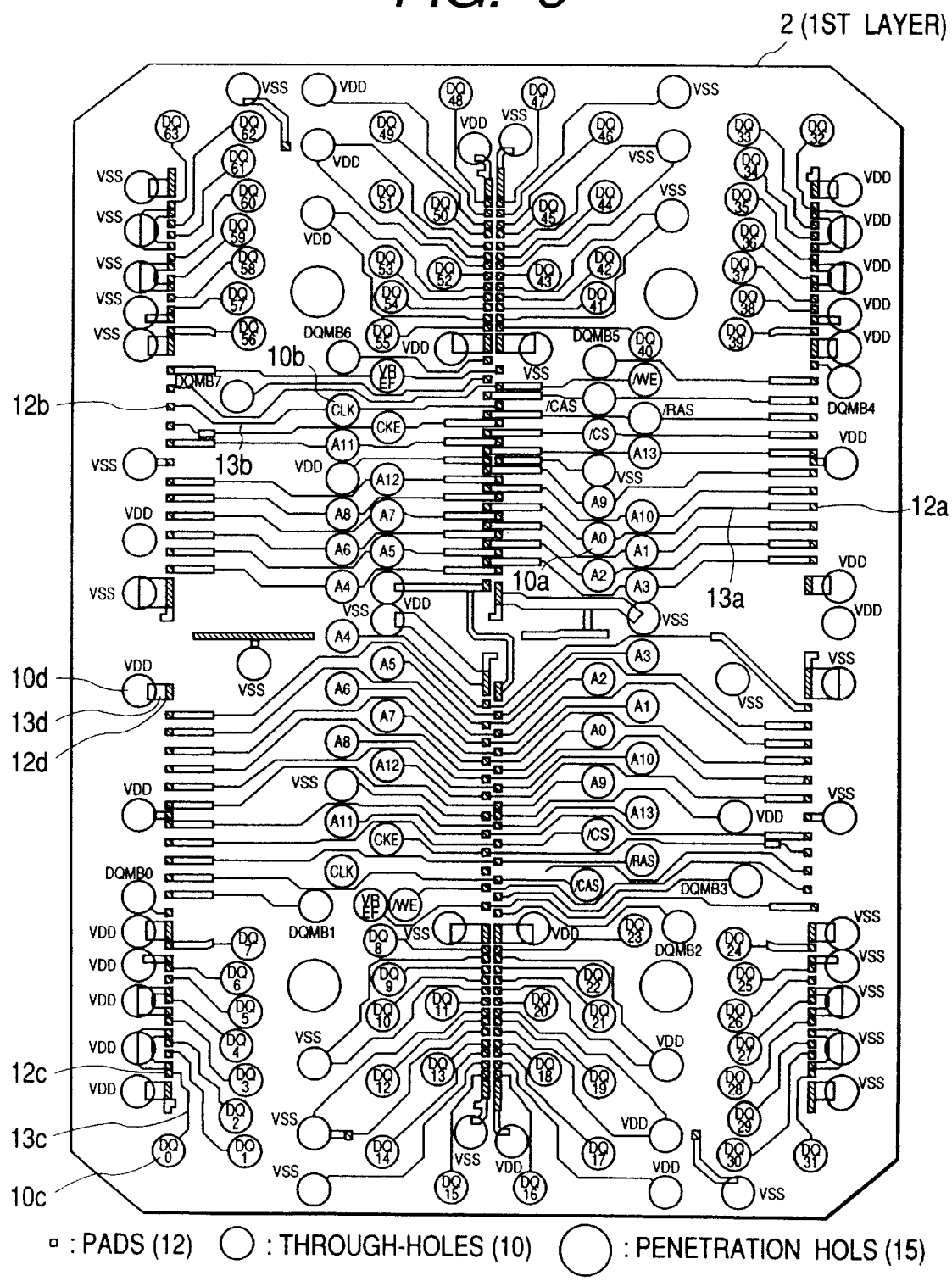
FIG. 6 is a plan view of an electrical lead pattern at the level of a first layer of the substrate in the embodiment 1 of the invention.
Figure 7:
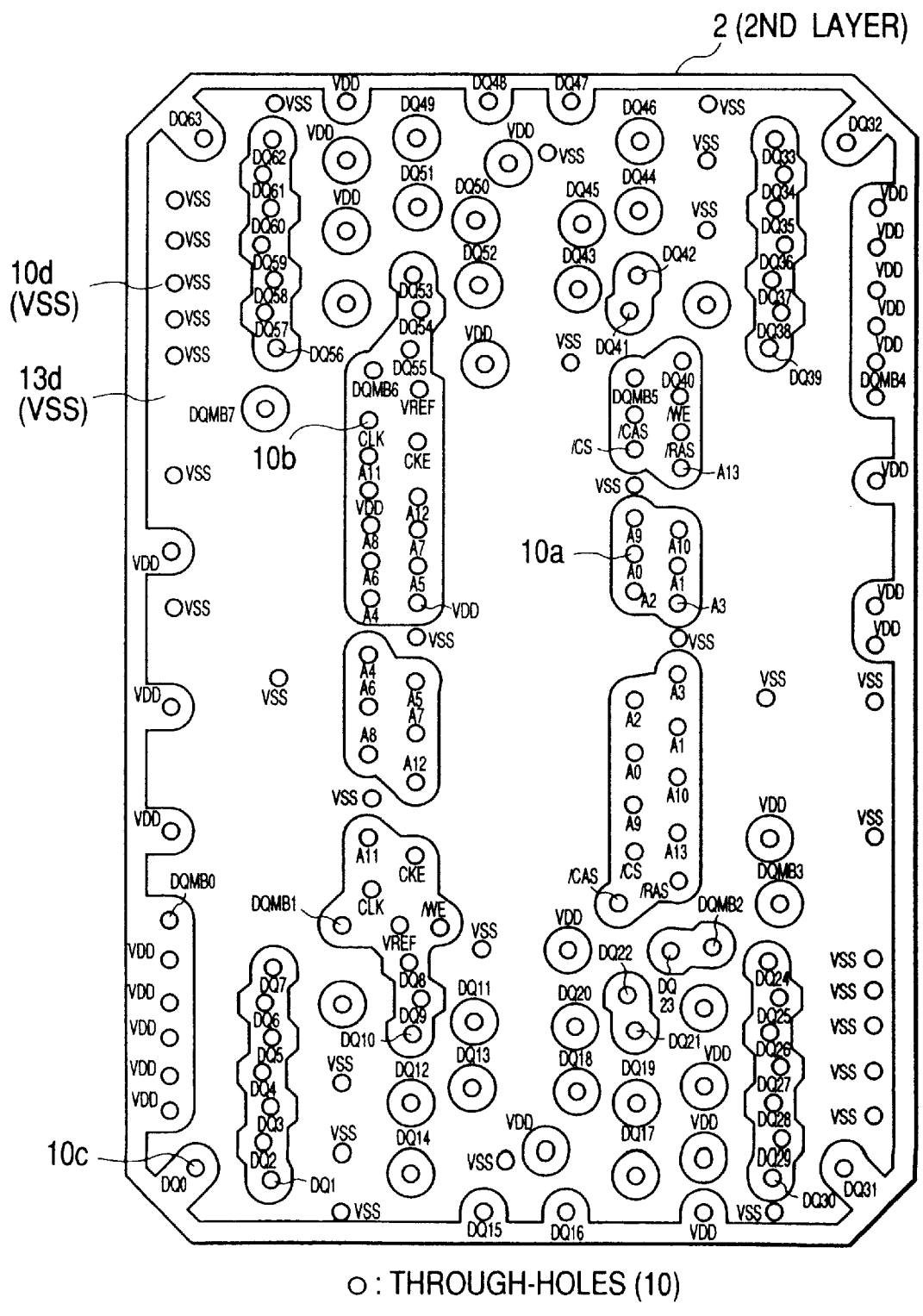
FIG. 7 is a plan view of a lead pattern at a second layer level of the substrate in the embodiment 1 of the invention.
Figure 8:
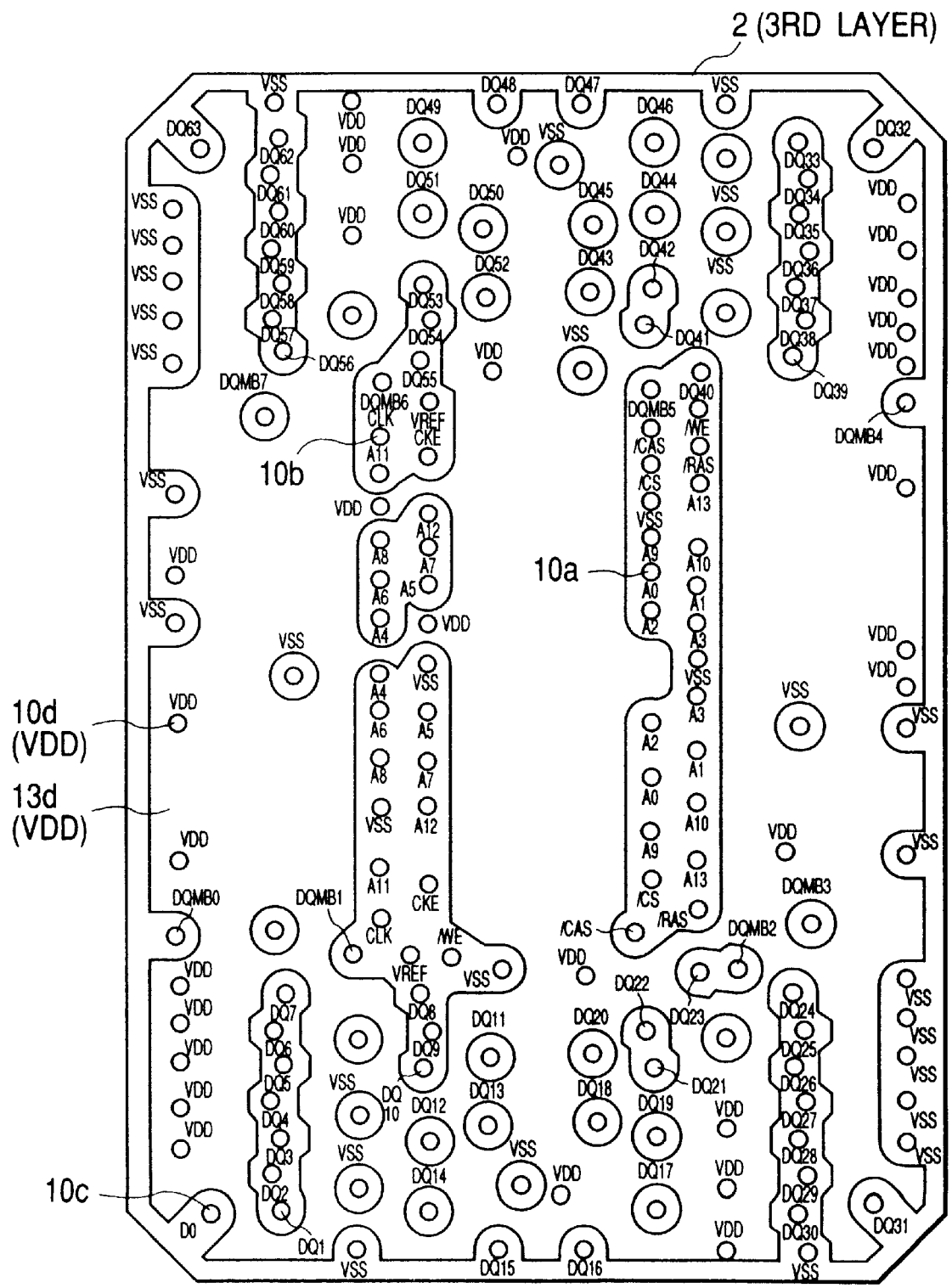
FIG. 8 is a plan view of a lead pattern at a third layer level of the substrate in the embodiment 1 of the invention.
Figure 9:
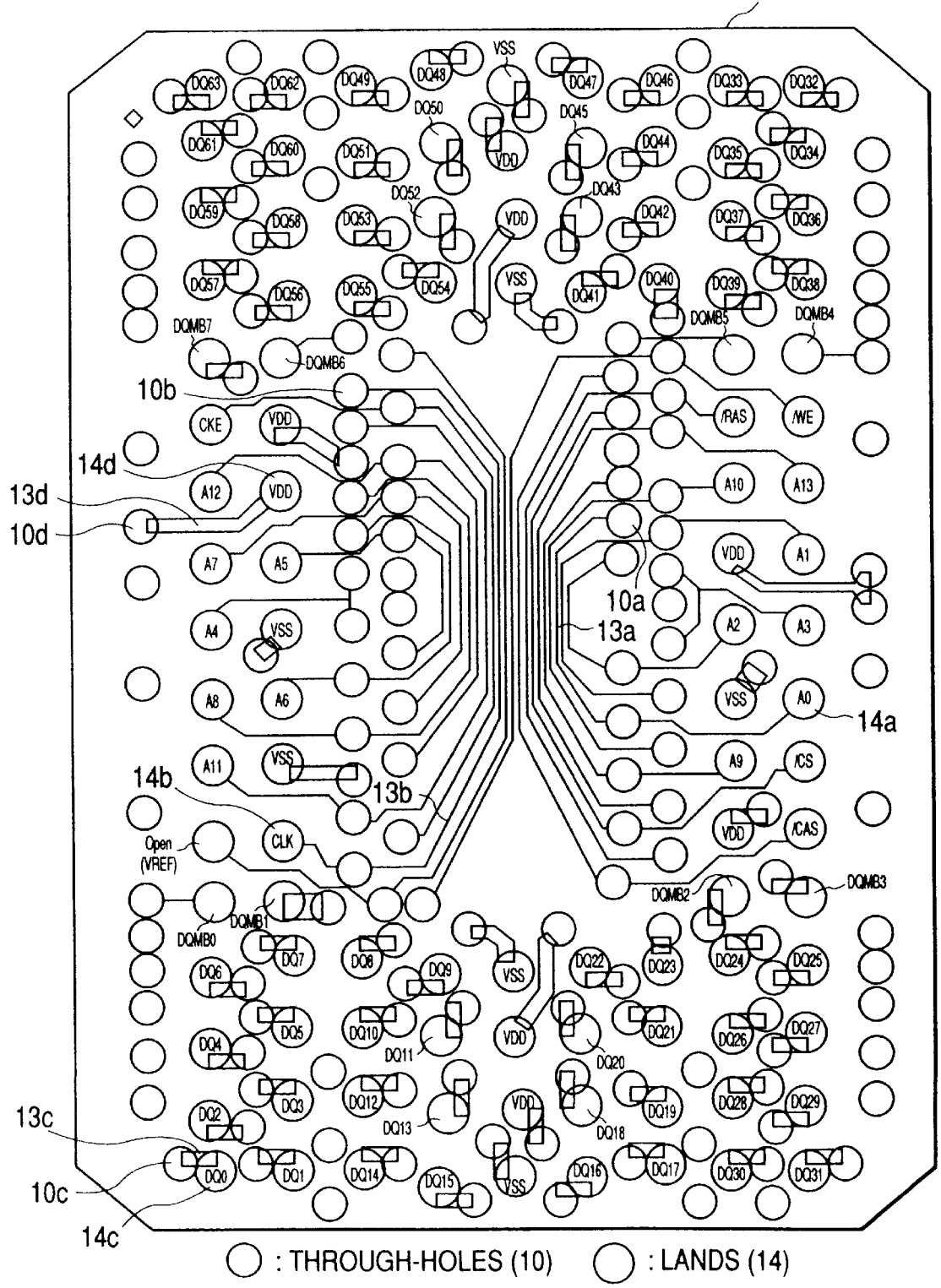
FIG. 9 is a plan view of a lead pattern at a fourth layer level of the substrate in the embodiment 1 of the invention.
Figure 10:
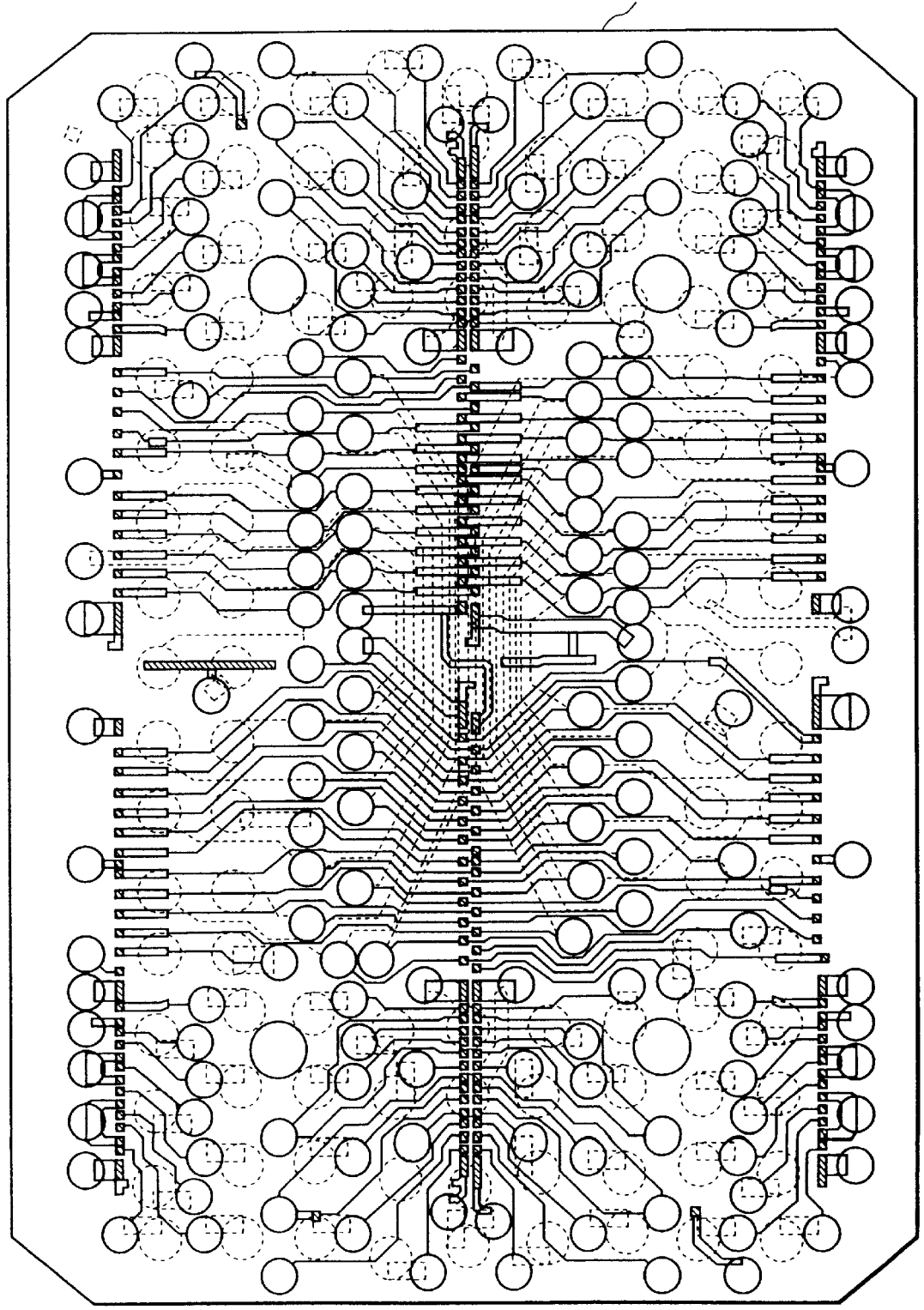
FIG. 10 is a plan view of the substrate as through-viewed from an upper face thereof in the embodiment 1 of the invention.
Figure 11:
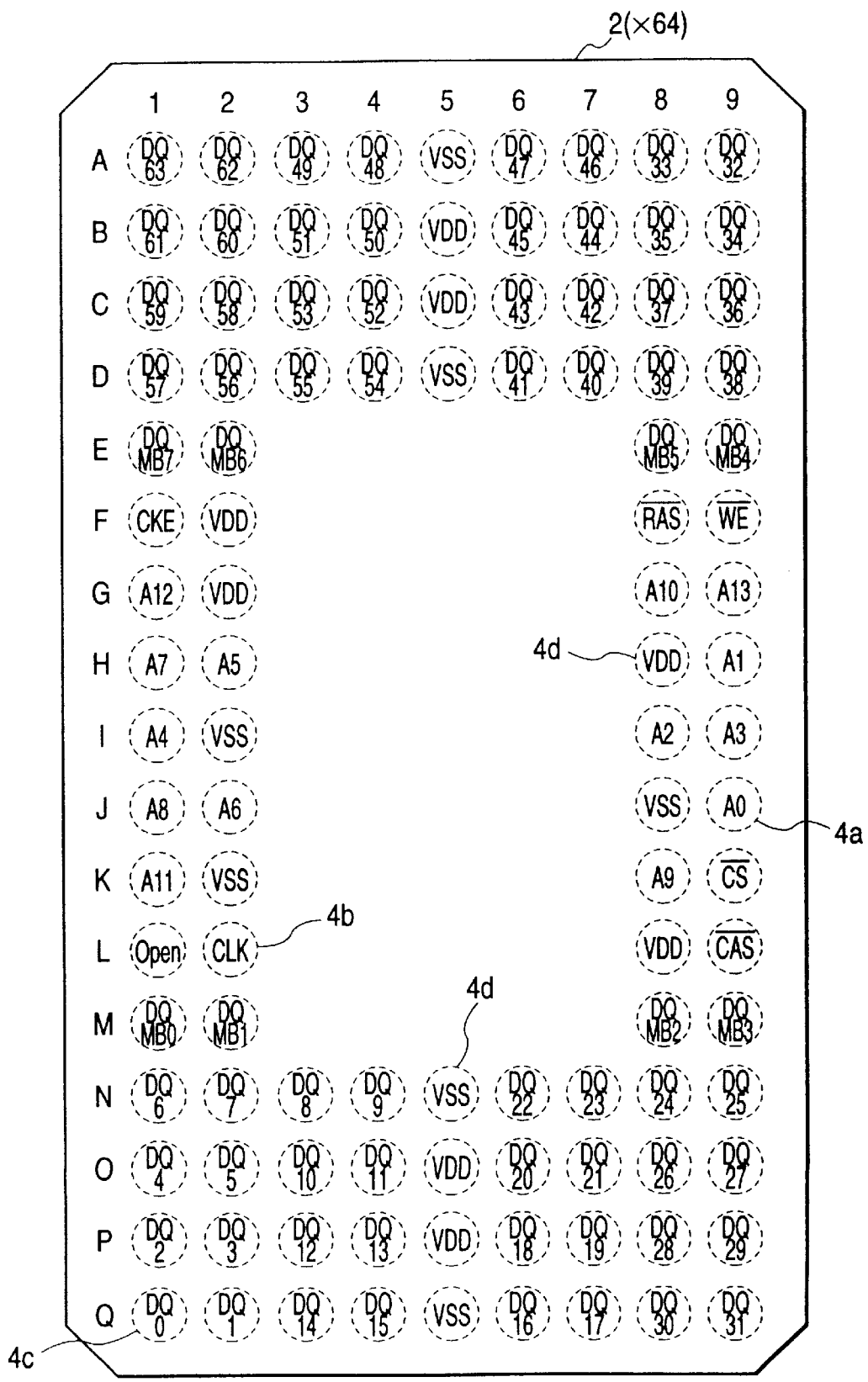
FIG. 11 is a plan view of the substrate as through-viewed from the upper face thereof to visually reveal the layout of external terminals (×64) in the embodiment 1 of the invention.
Figure 12:
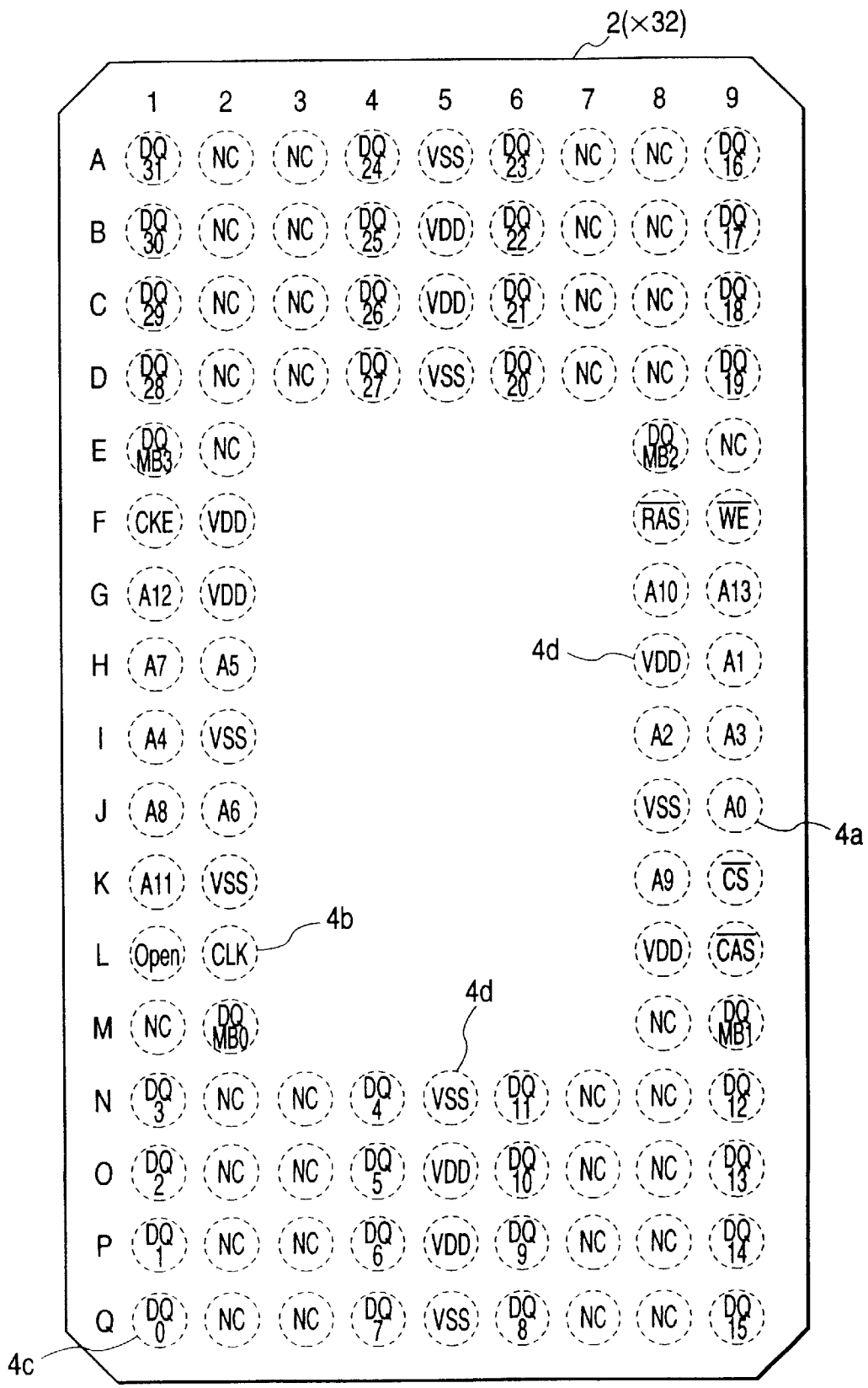
FIG. 12 is a plan view of the substrate as through-viewed from the upper face thereof to visually reveal the layout of external terminals (×32) in the embodiment 1 of the invention.

One exemplary structure of the substrate 2 will then be explained with reference to FIGS. 4–12. FIG. 4 is a diagram schematically showing a plan view of the substrate 2 with the chips 4 mounted thereon (the seal material 5 is not visible herein), FIG. 5 depicts a cross-sectional view of the structure of FIG. 4 along line B–B' (cross-section indication is omitted). FIGS. 6–9 are plan view diagrams showing lead patterns on respective layers of the substrate 2, wherein FIG. 6 shows a first layer, FIG. 7 shows a second layer, FIG. 8 shows a third layer, and FIG. 9 shows a fourth layer, respectively. FIG. 10 is a plan view of the substrate 2 as through-viewed from its upper surface, and FIGS. 11–12 are plan view diagrams each showing the layout of solder balls 4 when through-viewed from the upside of the substrate 2.

As shown in FIG. 4, the substrates of substantially rectangular planar shape (polygon having a pair of long sides and a pair of short sides) has its surface on which four chips 4 of substantially rectangular planar shape are mounted, each of which has a pair of long sides and a pair of short sides, wherein these four chips 1 are disposed into a 2D matrix (grid-like shape) array of two rows (in a lateral direction along short sides) and two columns in an up/down direction (along long sides). Let the lower left side be called a first chip 1a, the lower right one be a second chip 1b, the upper right one be a third chip 1c, and upper left one be a fourth chip 1d. For purposes of explanation only, the lower side chips 1a, 1b with respect to an index portion 8 formed of a gold plated film for indication of the direction of the substrate 2 are added with markings F indicative of the direction of chips 1 at the upper side thereof whereas the upper side chips 1c, 1d relative to the index 8 are added with similar markings F at the lower side thereof, respectively. These four chips 1 are disposed in such a manner that the upper side pair and the lower side pair thereof are in a linear symmetrical layout relative to the center line in the direction of the long sides of the substrate 2. In other words, the four chips 1 are laid out so that certain ones forming a pair with short-side marking F added thereto are located neighboring upon each other.

In addition, each chip 1 is such that a plurality of pads 9 is disposed thereon and organized into an almost linear array extending substantially along the center line in the short-side direction. While a detailed explanation as to the plurality of pads 9 being laid out to have the so-called "center pad layout" structure will be later given (in conjunction with FIGS. 14–16), they are laid out on one side of a pair of short sides to thereby permit address pads 9a to be located on the center side on the plane of the substrate 2, for common-use or "commonization" of an address signal. More specifically, the chips 1a, 1b that are disposed on the lower side of the substrate 2 in FIG. 4 have address pads 9a which are collected together at the upper part thereof whereas the remaining chips 1c, 1d that are disposed on the upper side of substrate 2 have address pads 9a which are collected together at the lower part thereof. Control pads 9b of control signals are similarly laid out so that these are positioned on the center side of the substrate 2. On the other hand, input/output pads 9c are laid out on the other side along the pair of short sides in such a manner that these are located on the peripheral side on the plane of substrate 2. Additionally, any specific regularity is not found relative to power supply pads 9d.

A cross-sectional view along line B–B' passing through this part of such address pads 9a is as shown in FIG. 5. As shown in FIG. 5, the substrate 2 is formed of a four-layer lamination structure, wherein a first layer acting as its uppermost layer is assigned to a signal layer (1), a second layer is assigned to a ground voltage (VSS) layer of the power supply, a third layer is to a power supply voltage (VDD) layer of the power supply, and a fourth layer serving as the lowermost layer is assigned to a signal layer (2), respectively. This four-layer lamination structured substrate 2 is such that desired lead wire patterns of respective layers are connected via through-holes 10 filled with conductive materials penetrating respective layers. In addition, the top surface and bottom surface of the substrate 2 are covered or coated with resist films 11 for electrical insulation, except for specified portions corresponding to the pads and lands.

The first, uppermost layer of this substrate 2 is arranged as shown in FIG. 6. Note here that although in FIG. 6 function assignment indicator markings are added only to the through-holes 10 due to a limitation to available space on the drawing sheet, the pads 9 are the same in function assignment as the through-holes 10 to be connected by an electrical lead pattern. Respective are such that A0–A13 designate address signals; DQ0–DQ63 denote input/output data; CLK (clock signal), CKE (clock enable signal), /CS (chip select signal, where "/" indicates an inversion symbol), /RAS (row address strobe signal), /CAS (column address strobe signal), /WE (write enable signal), and DQMB0–DQMB7 (data mask signals) denote control signals; VDD is the power supply; VSS, ground voltage, respectively.

The address signals A0–A13 are the signals that are for use in selecting any given memory cells in a memory array that constitutes the memory circuitry within the chip 1. The input/output data DQ0–DQ63 are those signals that will be input and output for writing or reading data into or from memory cells during write or read operations. Respective control signals CLK, CKE, ICS, /RAS, /CAS, /WE, DQMB0–DQMB7 are for use in controlling an operation of the memory circuitry. The power supply voltage VDD and ground voltage VSS are supplied for operation of the memory circuit.

As shown in FIG. 6, on the first layer of the substrate 2, a plurality of pads 12 being electrically connected via wires 3 to respective pads on the chip 1 respectively are laid out in the form of linear arrays along the long-side direction of the substrate, which include two "columns" at the center part thereof and two columns on the opposite sides of the peripheral portions of the substrate. This may be reworded in a way such that the pads 12 are organized into two columns lying inside and outside of a laterally subdivided parts-mount surface area on the surface of each chip 1. Additionally the through-holes 10 that are connected by a lead pattern to respective pads 12 are disposed at selected portions including but not limited to the parts-mount area of the chip 1 and the periphery of the substrate 2.

In the first layer of this substrate 2, especially for purposes of achievement of common use or "commonization" of more than one address signal, address pads 12a of address signals A0–A13 are collected together at specified part on the center side in the long-side direction of the substrate 2. Further, in FIG. 6, at laterally adjacent upper-side and lower-side pairs of chips 1, the address pads 12a of address signals A0–A13 that are disposed in the form of two columns at the center in the short-side direction are alternately different in position from each other. Furthermore, at every combination of two upside and downside chips 1, address-use leads 13a being connected to the address pads 12a of respective address signals A0–A13 and addressing through-holes 10a are made common. Furthermore, address leads 13a for connection between the address pads 12a of respective address signals A0–A13 and their corresponding address through-holes 10a are such that a lead pattern is wired in parallel to lateral directional leads extending in the short-side direction of the substrate 2—that is, in the rightward/leftward directions in FIG. 6.

For instance, an address pad 12a of address signal A0 of the right side chip 1c and an address pad 12a of address signal A0 of the left side chip 1d are connected together by a lateral directional address lead 13a, wherein an address through-hole 10a is provided at a location on this address wiring 13a. The address through-hole 10a corresponding to this address pad 12a of address signal A0 is provided within the parts-mount area of the right side chip 1c and is connected to an address wiring 13a on the fourth layer through an address through-hole 10a in the fourth layer as will be described later in the description. Similarly, the address pads 12a of address signals A1–A13 of the other upper lateral adjacent chips 1c, 1d are connected by lateral directional leads 13a with address through-holes 10a being located at specified portions therealong. At this combination of such upper chips 1c, 1d, addressing through-holes 10a corresponding to address pads 12a of the address signals A0–A3, A9–A10 and A13 are provided on the right side whereas addressing through-holes 10a corresponding to address pads 12a of the address signals A4–A8, A11 and A12 are provided on the left side thereof.

Further, in regard to address pads 12a of the address signals A0–A13 of the lower lateral chips 1a–1b also, these are commonly connected together by lateral directional address wiring leads 13a in a way similar to that of the upper ones. However, although the lower side chips 1a–1b are laid out in linear symmetrical with the upper side chips 1c–1d, the layout of address through-holes 10a is the same as those in the upside in that addressing through-holes 10a corresponding to address pads 12a of the address signals A0–A3, A9–A10 and A13 are provided on the right side whereas addressing through-holes 10a corresponding to address pads 12a of the address signals A4–A8, A11 and A12 are provided on the left side thereof. This is due to the relation with address leads 13a in the fourth layer to be later described.

The control signals such as CLK, CKE, /CS, /RAS, /CAS, /WE are such that these are commonized in a way similar to that of the address signals to be collected together on the center side in the long-side direction of the substrate 2, wherein two linear arrays of control pads 12b disposed at the center part in the short-side direction are different in position from each other between the upper side combination of two lateral chips 1 and the lower side combination of two lateral chips 1. In addition, control-use through-holes 10b and control-use leads 13b as connected to the control pads 12b of respective control signals are commonized at the upside and downside lateral two chips 1. Furthermore, control leads 13b for use in connecting together the control pads 12b of respective control signals and their corresponding control through-holes 10b are designed to have a laterally elongate wiring lead pattern. Additionally the layout of control through-holes 10b is such that the ones with the same functionality belonging to the upside and downside are provided on the same side of the left side or the right side.

On the other hand, input/output pads 12c of input/output data DQ0–DQ63 are collected together on the peripheral side (upside and downside) in the long-side direction of the substrate 2. A respective one of those groups of input/output pads 12c of the input/output data DQ0–DQ15 (lower left side), DQ16–DQ31 (lower right side), DQ32–DQ47 (upper right side), and DQ48–DQ63 (upper left side) is for use with signals corresponding to every chip 1, which may be separate ones that are provided in parallel independently of one another among the four chips 1. Similarly, input/output through-holes 10c and input/output leads 13c as connected to respective input/output pads 12c are also arranged separately.

Although power supply pads 12d of the power supply voltage VDD and ground potential VSS have no specific regularities in layout, these are disposed on the peripheral side (right side and left side)—namely, outside of the parts-mount area of chip 1 or the like. Power supply through-holes 10d being connected to these power supply pads 12d are provided outside of such area. Power supply wiring leads 13d for use in connecting together the power supply pads 12d and power supply through-holes 10d are connected by a lead pattern that is greater in width than those leads for transmission of signals such as input/output data.

An explanation will next be given of the second layer of the substrate 2 with reference to FIG. 7. In FIG. 7 also, respective reference characters added to through-holes 10 for indication of the function assignment thereof are the same as those in the first layer. As shown in FIG. 7, the second layer is designed to have the so-called "sheet-like solid" lead arrangement with a power supply lead 13d of the ground potential VSS being sheeted on the layer. More specifically, the second layer is such that the power supply lead "sheet" 13d including power-supply through-holes 10d of the ground potential VSS is coated thereon while letting peripheral portions of the other through-holes be associated with no leads, which include respective through-holes 10a–10c of the power supply voltage VDD, addressing signals A0–A13, input/output data DQ0–DQ63, and control signals CLK, CKE, /CS, /RAS, /CAS, /WE, DQMB0–DQMB7.

The third layer of the substrate 2 is as shown in FIG. 8. In FIG. 8 also, respective reference characters added to through-holes 10 for indication of the function assignment thereof are the same as those in the first layer. As shown in FIG. 8, the third layer is arranged to have the so-called sheet-like solid lead arrangement with a power supply lead 13d of the power supply voltage VDD being spread thereon. More specifically, the third layer is such that the power supply lead "sheet" 13d including power-supply through-holes 10d of the power supply voltage VDD is coated thereon while letting peripheral portions of the other through-holes be associated with no leads, which include respective through-holes 10a–10c of the ground potential VSS, addressing signals A0–A13, input/output data DQ0–DQ63, and control signals CLK, CKE, /CS, /RAS, /CAS, /WE, DQMB0–DQMB7.

Next, the lowermost, fourth layer of the substrate 2 is as shown in FIG. 9. It should be noted that although in FIG. 9 the function assignment symbols are added only to those lands 14 to which solder balls 4 are to be adhered due to a limitation of available space on the drawing sheet, through-holes 10 will be the same in function assignment as the lands 14 as connected by a wiring lead pattern. Respective reference characters are the same in function assignment as those in the first layer stated supra.

As shown in FIG. 9, the fourth layer of the substrate 2 is arranged so that a plurality of lands 14 to which solder balls 4 are to be electrically connected is laid out at the periphery of substrate 2 excluding the center part thereof. More specifically, in order to reduce complexity in resultant wiring lead pattern, the lands 14 are provided and organized into a matrix of eight (8) rows and nine (9) columns, which matrix consists of an upper side sub-matrix and a lower side submatrix each consisting of four (4) rows and nine (9) columns, wherein the rows extend along the short sides of the substrate 2 whereas the columns extend along the long sides thereof, and are provided at the center part into a matrix of 9 rows and 4 columns as divided into a right side 9-row/2-column submatrix and a left side 9-row/2-column submatrix. Hence, the solder balls 4 to be adhered to these lands 14 are provided which consist of one hundred and eight (108) ones (where 108=8×9+9×4). In addition, through-holes 10 that are connected by a lead pattern to respective lands 14 are disposed at the same locations as those in the aforesaid first to third layers in such a manner as to be used in common or "commonized" between the upper and lower two chips 1.

In the fourth layer of this substrate 2, especially in order to commonly use or "commonize" address signals in the same way as that in said first layer, addressing lands 14a of address signals A0–A13 corresponding to the upper-and-lower/right-and-left four chips 1 are commonized so that these are collected together at locations on the opposite sides—i.e. on the right side and left side —in the long-side direction of the substrate 2. Further, address leads 13a for use in connecting together address lands 14a of respective address signals A0–A13 and their corresponding address through-holes 10a are designed into the form of longitudinal wiring leads extending in the long-side direction of the substrate 2—in other words, they are railed to have a lead pattern resembling wave ripples in the up/down direction of FIG. 9. Additionally, the layout of address through-holes 10a is such that the ones with the same functionality belonging to the upside and downside are provided on the same side of the left side or the right side.

For example, addressing through-holes 10a corresponding to the upper side chips 1c, 1d for connection to the address land 14a of address signal A0 being disposed on the right side of the substrate 2 and address through-holes 10a corresponding to the lower side chips 1a, 1b are connected together by a laterally elongated address lead 13a. And, the address lead 13 is railed from one of the address through-holes 10a which is on the lower side toward the address land 14a of address signal A0. Similarly, those address through-holes 10a being connected to the remaining address lands 14a of address signals A1–A3, A9–A10, A13 which are disposed on the right side are also connected by longitudinal address leads 13a. Furthermore, those address through-holes 10a being connected to the address lands 14a of address signals A4–A8, A11–A12 which are disposed on the left side these are also connected by longitudinal address leads 13a in the same manner as that on the right side.

Further, regarding the control signals CLX, CKE, /CS, /RAS, /CAS, /WE, and the like also, these are commonized in the same way as that of the address signals and control lands 14b are collected together at the opposite sides—i.e. on the right side and left side—in the long-side direction of the substrate 2. Furthermore, control leads 13b for use in connecting together the control lands 14b of respective control signals and their corresponding control through-holes 10b are organized into the form of a longitudinally elongate lead pattern. Additionally the layout of control through-holes 10b is provided on the same side relative to the upper side and the lower side on the other hand, input/output lands 14c of input/output data DQ0–DQ63 are collected together at corner edge portions on the periphery in the long-side direction of the substrate 2. These respective lands 14c of input/output data DQ0–DQ15 (lower left side), DQ16–DQ31 (lower right side), DQ32–DQ47 (upper right side) and DQ48–DQ63 (upper left side) are those signals corresponding to every chip 1 and are provided in parallel independently among the four chips 1. Additionally, input/output through-holes 10c and input/output leads 13c as connected to respective input/output lands 14c are also arranged separately. Input/output leads 13c for use in connecting together these respective input/output lands 14c and input/output through-holes 10c are connected by a "fat" lead pattern with increased line widths.

Although power supply lands 14d of the power supply voltage VDD and ground potential VSS have no specific regularities for layout, these are mainly disposed at or near the center part in the short-side direction of the substrate 2 and/or on the opposite sides—the right side and left side—of the center part in the long-side direction or the like. Power supply through-holes 10d being connected to these power supply lands 14d are provided at peripheral edge portions in the short-side direction. Power supply wiring leads 13d for use in connecting together the power supply lands 14d and power supply through-holes 10d are connected by a "fat" lead pattern with increased line widths.

As has been discussed above, in the substrate 2 of the illustrative embodiment, it becomes possible, by commonly using or "commonizing" the address signals A0–A13 of four separate chips 1 as mounted on the substrate 2, to achieve the intended electrical connection from the first-layer addressing pads 12a via the laterally extending address leads 13a and address through-holes 10a to the fourth-layer longitudinal address leads 13a and address lands 14a. Similarly, it is also possible, by commonly sharing or "commonizin" the control signals CLK, CKE, /CS, /RAS, /CAS, /WE, to attain the intended electrical connection from the first-layer control pads 12b via the laterally extending control leads 13b and control through-holes 10b to the fourth-layer longitudinal control leads 13b and control lands 14b.

On the other hand, regarding the input/output data DQ0–DQ63 of the four chips 1 mounted on the substrate 2, it is possible to attain electrical connection from the first-layer input/output pads 12c via the input/output leads 13c and input/output through-holes 10c to the fourth-layer input/output leads 13c and input/output lands 14c in an independent and parallel fashion.

Turning now to FIG. 10, there is shown a plan view of the first and fourth level signal layers in this substrate 2, which is through-viewed from the upside thereof. As apparent from viewing FIG. 10 also, it would be readily understandable that a wiring lead pattern of the address leads 13a and control leads 13b at the center part in the long-side direction of the substrate 2 is formed of longitudinally extending leads (first layer) and lateral leads (fourth layer), each of which is connected via an address through-hole 10a and control through-hole 10b.

In addition, solder balls 4 are laid out on the bottom or back surface of the substrate 2, which have functions corresponding to the function assignment of respective lands 14 on the fourth layer, wherein the layout and function assignment are as shown in FIG. 11 and FIG. 12 (each is a diagram as looked at from the upside thereof). FIG. 11 corresponds to a ×64 input/output bit configuration whereas FIG. 12 corresponds to a ×32 input/output bit configuration, which will be described later. It would readily occur to those skilled in the art from viewing FIGS. 11–12 that those addressing solder balls 4a of commonly usable or "commonizeable" address signals and solder balls 4b of control signals are laid out on the opposite sides of the center part in the long-side direction of the substrate 2 whereas input/output solder balls 4c of input/output data are disposed at specified portions at the peripheral edges in the long-side direction of substrate 2. Additionally, solder balls 4d of the power supply voltage VDD and ground potential VSS are at certain locations at the center part in the short-side direction of the substrate 2 and also on the both sides, i.e. right side and left side, of the center part thereof and the like.

Figure 13:
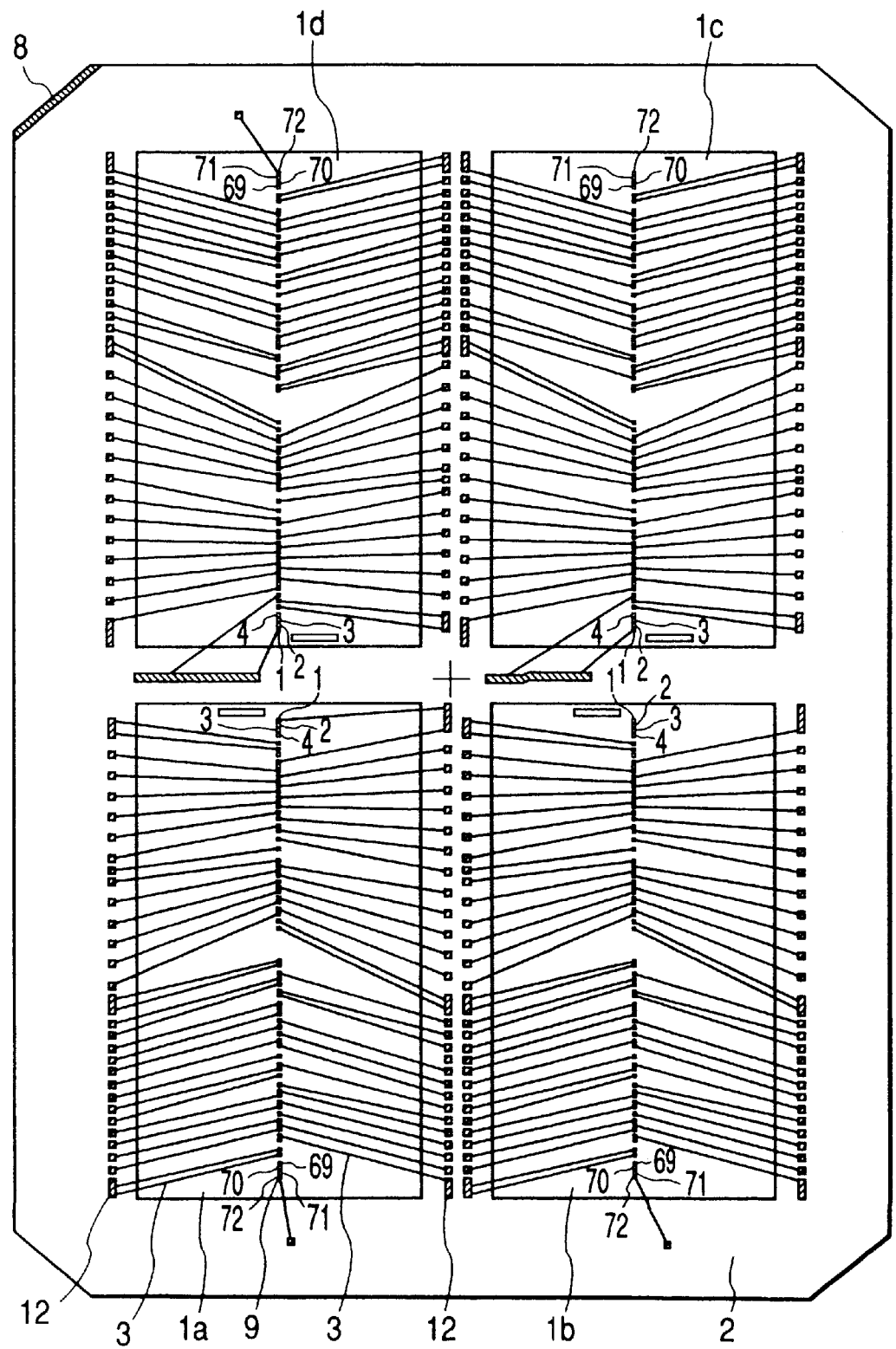
FIG. 13 is a plan view showing electrical connection state of wires in the embodiment 1 of the invention.
Figure 14:
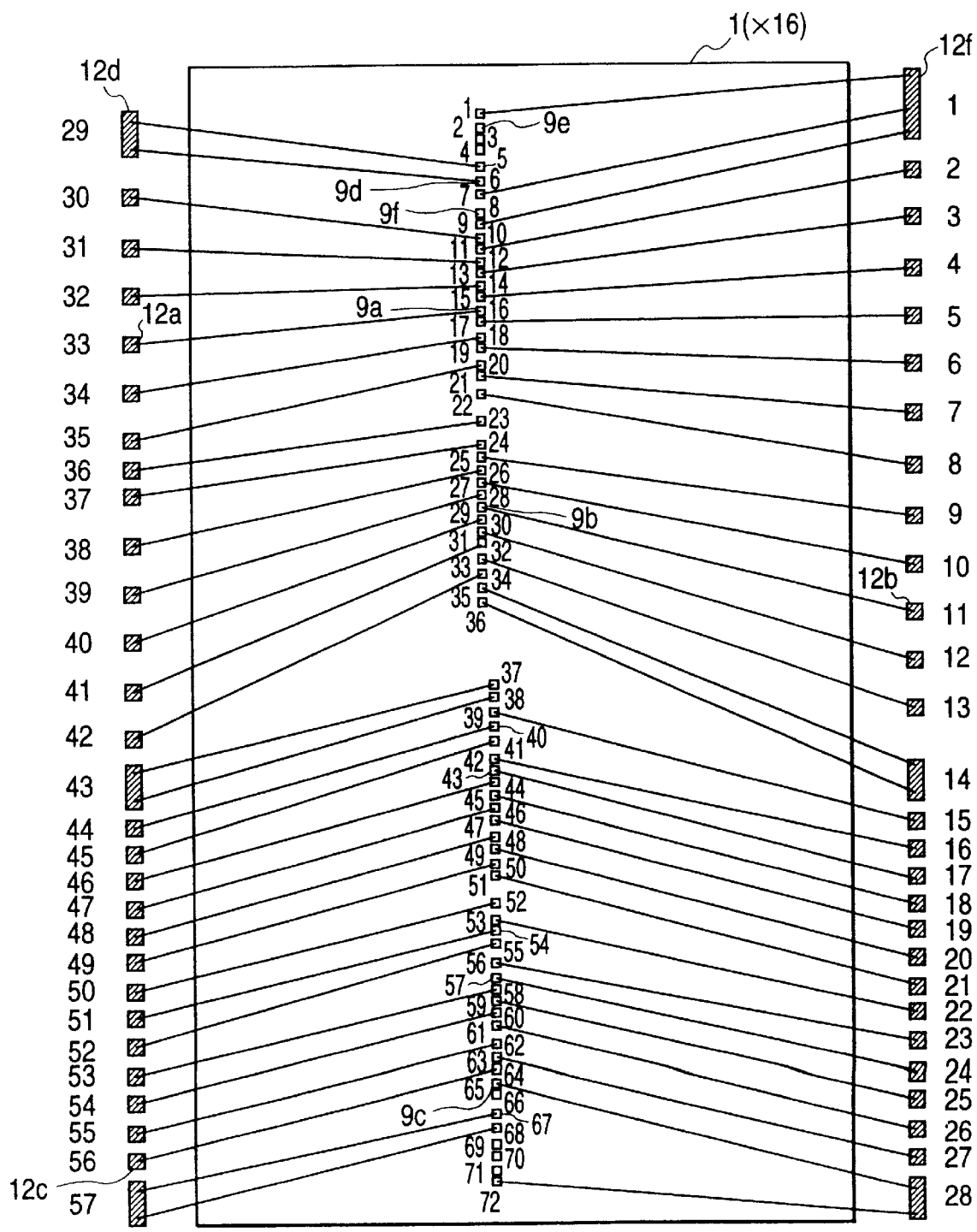
FIG. 14 is a plan view showing a connection state of ×16 input/output bit configuration in the embodiment 1 of the invention.
Figure 15:
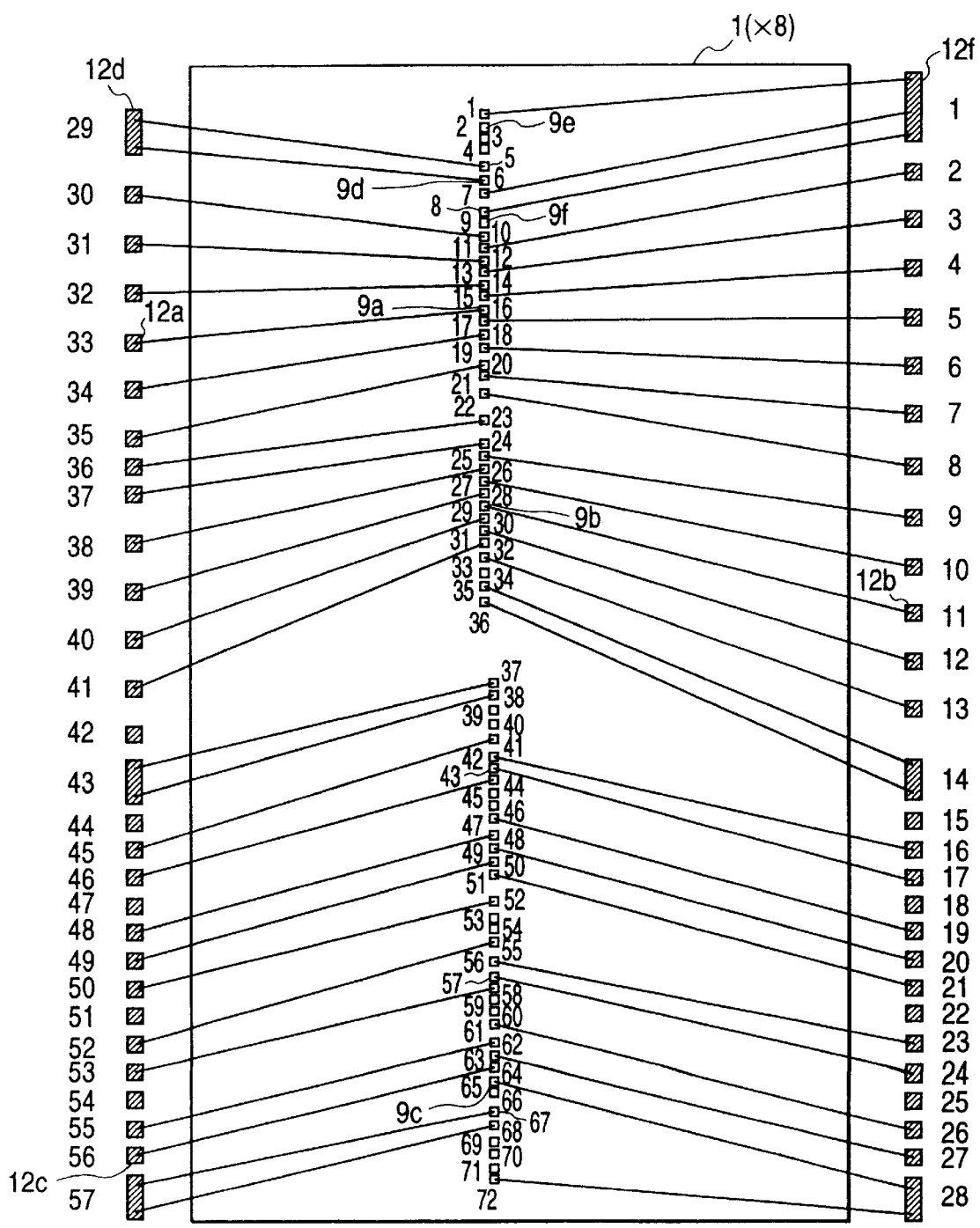
FIG. 15 is a plan view showing a connection state of ×8 input/output bit configuration in the embodiment 1 of the invention.

An explanation will next be given of one example of the wire bonding between the pads 9 on the chips 1 and the pads 12 on the substrate 2 with reference to FIGS. 13–19. FIG. 13 is a plan view diagram showing a connection state of wires 3; FIG. 14 is a plan view showing a connection state of ×16 input/output bit configuration; and, FIG. 15 is a plan view showing a connection state of ×8 input/output bit configuration. FIG. 16 is a table indicating the function assignment of pads 9 on chips 1; and FIG. 17 indicates function assignments of respective ×16- and ×8 -input/output bit configurations of pads 12 on the substrate 2. FIG. 18 is a function assignment table schematically showing a ×64 (×16) input/output bit configuration whereas FIG. 19 is a function assignment table schematically showing a ×32 (×8) input/output bit configuration.

As shown in FIG. 13, in the state that four chips 1 are mounted on the substrate 2, wires 3 are substantially alternately bonded for electrical connection from pads 9 on each chip 1 toward the pads 12 that are disposed on the opposite sides—right side and left side—of each chip 1 on the substrate 2. An enlarged view of one of these four chips 1 is shown in greater detail in FIGS. 14–15, which show ×16- and ×8-input/output bit configurations respectively. In summary, either one of the ×16- and ×8- input/output bit configurations is achievable by use of the same chip 1 while changing coupling of wires 3 therefor.

The function assignment of the pads 9 on the chip 1 is as shown in FIG. 16. Those pads 9 with pad numbers 1–36 added thereto are laid out at the center side in the long-side direction of the substrate 2 whereas those added with pad numbers 37–72 are disposed on the peripheral side in the long-side direction of the substrate 2. As shown in FIGS. 14–15, respective pads 9 on this chip 1 are more precisely such that these are provided along the long-side direction in such a manner as to be slightly shifted in position from the center line in the short-side direction while letting a slight offset be found between the pad numbers 1–36 and pad numbers 37–72. Note here that such pad offset layout to one side may be freely modified on a case-by-case basis and that the invention should not be limited only to said example.

Especially, in regard to the layout of respective pads 9 on the chip 1, addressing pads 9a of the address signals A0–A13 (pad numbers 10–21 and 24–25) are assigned in the pad numbers 1–36 located on the center side in the long-side direction of the substrate 2. Further, control pads 9b of the control signal CLK (pad number 29), CKE (pad number 27), /CS (pad number 26), /RAS (pad number 28), /CAS (pad number 30), and /WE (pad number 32) are also assigned in the pad numbers 1–36 on the center side in the long-side direction of the substrate 2.

On the other hand, input/output pads 9c of the input/output data DQO–DQ15 (pad numbers 39–40, 43–46, 49–50, 53–54, 57–60 and 63–64) are assigned in the pad numbers 37–72 located on the peripheral side in the long-side direction of the substrate 2. Additionally the input/output data DQ0–DQ15 correspond to the chip 1a; the remaining chips 1b–1d correspond to the input/output data DQ16–DQ31, input/output data DQ32–DQ47, and input/output data DQ48–DQ63, respectively.

In addition, power supplying pads 9d pertaining to the power supplies (VDD, VSS, VDDI, VSSI, VDDQ, VSSQ, VDDIU, VSSIU) and test/inspection pads 9e concerning probe-test use power supplies (VBB, VPLT, VPP, VPERI, VDL, VBLR) are assigned without any specific regularities.

The pads 9 on the chip 1 also include option-use pads 9f having a bonding option function, which pads are assigned to the pad numbers 8 (BOP1B), 9 (BOP2B), and 66 (BOPOB), wherein alteration of connection between these option pads 9f on the chip 1 and option pads 12f on the substrate 2 which have bonding-option functionality makes it possible to establish ×16 or ×8 input/output bit configuration. Note that in the case of establishment of ×8 input/output bit configuration, no wire bonding processes are applied to those input/output pads 9c of DQ8–DQ15 as selected from among the input/output pads 9c of the input/output data DQO–DQ15.

Function assignment of respective pads 12 on the substrate 2 is as shown in FIG. 17. Note here that as FIG. 17 shows assignment corresponding to a single chip (1a), actually a four-time greater number of pads 12 corresponding to four separate chips 1 are disposed and assigned in a way similar thereto. Those pads 12 of pad numbers 1–28 are provided on the right side of the parts-mount area of the chip 1 whereas pads 12 of pad numbers 29–57 are on the left side of the parts-mount area of the chip 1. In addition, pads 12 of pad numbers 1–13, 29–42 are laid out so that these are located on the center side in the long-side direction of the substrate 2 whereas pads 12 of pad numbers 14–28, 43–57 are on the peripheral side in the long-side direction of the substrate 2. Of those pads, the pad 12 of pad number 1 is designed to have a specified size large enough to permit three, or more or less, wires 3 to be connected thereto; the pads 12 of pad numbers 14, 28–29, 43, 57 are each designed to have a size large enough to permit two, or more or less, wires 3 to be tied thereto.

In particular, with regard to the layout of respective pads 12 on the substrate 2, in the same manner as that of the pads 9 on the chip 1, addressing pads 12a of the address signals A0–A13 (pad numbers 2–7, 9, 30–35 and 37) are assigned in the pad numbers 1–13, 29–42 located on the center side in the long-side direction of the substrate 2. Further, control pads 12b of the control signal CLK (pad number 11), CKE (pad number 10), ICS (pad number 38), /RAS (pad number 39), /CAS (pad number 40), and /WE (pad number 12), DQMU (pad number 41), DQML (pad number 42) are also assigned in the pad numbers 1–13, 29–42 on the center side in the long-side direction of the substrate 2.

On the other hand, in the same as that of the input/output pads 9c on the chip 1, input/output pads 12c of input/output data DQ0–DQ15 (pad numbers 15, 17–18, 20, 22, 24–25, 27, 44, 46–47, 49, 51, 53–54, 56) are assigned in the pad numbers 37–72 as located on the peripheral side in the long-side direction of the substrate 2. Regarding these input/output pads 12c, in addition to said input/output data DQ0–DQ15 corresponding to the chip 1a, respective pads of input/output data DQ16–DQ31 corresponding to the chip 1b, input/output data DQ32–DQ47 corresponding to the chip 1c, and input/output data DQ48–DQ63 corresponding to the chip 1d are disposed on the substrate 2.

Additionally, power supply pads 12d as to the power supplies (VDD, VSS, VREF) are assigned with no specific regularities as in the power supply pads 9d on the chip 1.

The pads 12 on the substrate 2 also include option-use pads 12f having a bonding option function, which pads are assigned to the pad number 1 (BOP2B, BOP1B), wherein alteration of connection between these option pads 12f on the substrate 2 and option pads 9f on the chip 1 makes it possible to establish ×16 or ×8 input/output bit configuration. For instance, the ×16 input/output configuration is achievable by connecting the option pad 9f (BOP2B) of the pad number 9 on the chip 1 to the option pad 12f (ground potential VSS) of pad number 1 on the substrate 2. Alternatively, the ×8 input/output configuration may be established by connecting the option pad 9f (BOP1B) of the pad number 8 on the chip 1 to the option pad 12f (ground potential VSS) of pad number 1 on the substrate 2.

Further, in the case of establishment of the ×8 input/output bit configuration, it will no longer be required that wires 3 be connected to the input/output pads 12c of DQ8–DQ15 as selected from among the input/output pads 12c of input/output data DQO–DQ15 on the substrate 2; thus, no wire bonding will be carried out. In this case, since assignment of the input/output data DQ0–DQ15 (×16), DQ0–DQ7 (×8 ) is different between the ×16 and ×8 input/output bit configurations, that is, they are in relation of correspondence of DQ0(×16)-DQ0(×8), DQ1 - NC (No Connection), DQ2 - DQ1, DQ3 - NC, DQ4 - DQ2, DQ5 - NC, DQ6 - DQ3, DQ7 - NC, DQ8 - NC, DQ9 - DQ4, DQ10 - NC, DQ11 - DQ5, DQ12 - NC, DQ13 - DQ6, DQ14 - NC, DQ15 DQ7, no wires 3 are connected to the input/output pads 12c of the pad numbers 15, 18, 22, 25, 44, 47, 51, 54 in the case of establishment of the ×8 input/output bit configuration.

In addition, regarding the control signals of data mask signals, it will also be required that wires 3 be connected to the control pads 12b of the pad numbers 41 (DQMU), 42 (DQML) on the substrate 2 in the case of the ×16 input/output bit configuration; in the case of the ×8 input/output bit configuration, let wires 3 be connected to the control pad 12b of the pad number 41 (DQM) on the substrate 2.

A function arrangement of the resulting package having the four chips 1 of ×16 'or ×8 input/output bit configuration with the wire bonding completed in the way noted above is schematically shown in FIG. 18 (×16-4M: ×64), FIG. 19 (×8—8M: ×32). An either one of the illustrative chips is 64-Mbit SDRAM, wherein the package of ×64 input/output bit configuration is of function assignment of 4M×16 whereas the package of ×32 input/output bit configuration is 8M×8 in function assignment. The memory capacity of such package becomes 256 Mbit.

As shown in FIG. 18, the package of ×64 input/output bit configuration is such that address signals A0–A13, chip select signal /CS, row address strobe signal /RAS, column address strobe signal /CAS, write enable signal /WE, clock signal CLK, and clock enable signal CKE are input in common to the four separate chips 1. Data mask signals DQMB0–DQMB7 are supplied in a way such that DQMB0 (DQMU) and DQMB1 (DQML) are input to the first chip 1a, DQMB2 and DQMB3 are to the second chip 1b, DQMB4 and DQMB5 are to the third chip 1c, and DQMB6 and DQMB7 are to the fourth chip 1d, respectively. Input/output data DQ0–DQ64 are such that DQ0–DQ15 are input/output relative to the first chip 1a, DQ16–DQ31 are to the second chip 1b, DQ32–DQ47 are to the third chip 1c, and DQ48–DQ63 are to the fourth chip 1d, respectively.

An operation of this ×64 input/output bit configuration is such that the internal circuitry of each chip 1 is operation-controlled on the basis of the control signals /CS, /RAS, /CAS, /WE, CLK, CKE, DQMB0–DQMB7. One example is that during read and write operations, a row address signal and a column address signal are input to a row decoder and column decoder respectively within each chip 1 so that any given memory cell or cells will be selected in the memory array thereof. And, during reading, data of more than one memory cell thus selected is output from an output buffer via a sense amplifier and input/output bus, which will then be read out as input/output data DQ0–DQ63 in a ×64 input/output bit configuration. Additionally, during writing, input/output data DQ0–DQ63 will be input from an input buffer in the ×64 input/output bit configuration and then written into those memory cells being presently selected.

On the other hand, as shown in FIG. 19, the package of ×32 input/output bit configuration is generally similar in operation to the package of ×64 input/output bit configuration—i.e. address signals A0–A13 and the control signals /CS, /RAS, /CAS, /WE, CLK, CKE are commonly input to the four chips 1. Data mask signals DQMB0–DQMB3 are supplied in a way such that DQMB0

(DQM) is input to the first chip 1a, DQMB1 is input to the second chip 1b, DQMB2 is to the third chip 1c, and DQMB3 is to the fourth chip 1d, respectively. Input/output data DQ0–DQ31 are such that DQ0–DQ7 are input and output to and from the first chip 1a, DQ8–DQ15 are input/output to/from the second chip 1b, DQ16–DQ23 are to/from the third chip 1c, and DQ24–DQ31 are to/from the fourth chip 1d, respectively.

An operation of this x32 input/output bit configuration is similar to that of the package of x64 input/output bit configuration and is performed in such a way that the internal circuitry of each chip 1 is operation-controlled on the basis of the control signals /CS, /RAS, /CAS, /WE, CLK, CKE, DQMB0–DQMB3 for selection of a given memory cell or cells in the memory array on the basis of address signals A0–A13. And, during reading, data of more than one memory cell thus selected is output as input/output data DQ0–DQ31 from an output buffer in association with x32 input/output bit configuration; during writing, input/output data DQ0–DQ31 will be input from an input buffer in the x32 input/output bit configuration and then written as data into presently selected memory cells.

A detailed explanation will next be given of one example of the bonding structure of the pads 9 on chips 1 and the pads 12 on substrate 2, in conjunction with FIGS. 20–21 below. FIG. 20 is a schematical plan view of the coupling state of a single wire 3, and FIG. 21 is a sectional view as taken along line C–C' of FIG. 20.

As shown in FIG. 20, in the package with four separate chips 1 mounted on the substrate 2, a single wire 3 is tied between a pad 9 on chip 1 and a pad 12 on substrate 2. A sectional view of this structure along line C–C' passing through this portion of wire 3 is shown in FIG. 21. As shown in FIG. 21, the substrate 2 is provided with solder balls 4 on the back surface thereof, wherein specified portions excluding these solder balls 4 and portions excluding pads 12 on the surface are covered or coated with a resist 11 for electrical insulation. In addition to the above-noted through-holes 10 penetrating the substrate 2 from its top surface to bottom surface, this substrate 2 has a penetration hole 15 for use in forcing moisture vapor to escape outwardly, which vapor can be generated during thermal processing at solder-reflow process steps. This will especially be effective in cases where some problems exist as to the reflow characteristics in combination of members.

Further, in the case of provision of the penetration hole 15, said resist 11 covering the surface is provided at the periphery of this penetration hole 15, as a step-like height difference correction member which serves to reduce any possible step-like surface irregularities. Furthermore, in order to prevent unwanted blocking of this penetration hole 15, a die-bonding material 7 is disposed to cover up to a location as slightly spaced part from the periphery of the penetration hole 15.

In the wire bonding procedure, in cases where the pads 12 on the substrate 2 are in close proximity to the lateral sides of chips 1 due to limitations of external shape, wire bonding is carried out with the pads 12 on substrate 2 being as a first bond side of wire bonding and with the pads 9 on chips 1 being as a second bond side thereof. This makes it possible to improve the distance margin between such chips 1 and wires 3. Additionally as the wires 3 are forced to rise up on the first bond side, it is possible to reduce the height of wires 3 from the surface of the substrate 2.

Further, in the case of performing wire bonding processes, it will often happen that wiring lead patterns can be damaged depending on the passivation strength at the periphery of the pads 9 on chips 1. To eliminate this damageability, gold balls 16 are prebonded onto the pads 9 on chips 1; then, second bonding is applied to these gold balls 16. This is done through effectuation of known good die (KGD) processes, and will be similarly effective in cases where gold balls 16 reside on the pads 9. The same will also be effective even where the first bonding is performed relative to the pads 9 on chips 1.

An explanation will next be given of an assembly flow of a BGA surface-mount type package in accordance with this embodiment, in conjunction with FIG. 22 below.

At the beginning, prior to the intended assembly, there are prepared chips 1 each of which has been cut by dicing techniques away from a wafer and has an SDRAM formed thereon, a substrate 2 of four-layer lamination structure which was formed into a strip-like shape in units of a plurality of—e.g. six (6) or more or less-ones, a die-bonding material 7 such as epoxy resin, wires 3 made of for example gold, a sealing material 5 such as epoxy resin, solder balls 4 made of for example plumbum/stannum or lead/tin, and others.

Firstly, at a die-bonding process step, let respective ones of a plurality of chips 1 be mounted on respective parts-mount regions on the substrate 2 as formed into strip-like shape through the die-bonding material 7 (at step S1 in FIG. 22). During this process, attempts are made to prevent the die-bonding material 7 from badly behaving to block a penetration hole or holes 15 defined in the substrate 2.

Further in a wire bonding process, let respective pads 9 on respective plural chips 1 be connected by wires 3 to respective pads 12 on the substrate 2 (at step S2). In this case, first bonding is performed relative to the pads 12 on the substrate 2 causing after fabrication of gold holes on these pads 12 the wires 3 to rise up and then curve toward the chip 1 side, thereby performing second bonding on the gold balls 16 of the pads 9 on chips 1.

Subsequently, in a sealing process, use the seal material 5 to mold the strip-shaped substrate 2 with the plurality of chips 1 mounted thereon to ensure that the chips 1 and wires 3 will hardly be exposed (at step S3 in FIG. 22). At this time, heat up for plasticization the seal material 5 by transfer molding techniques, for example; then, insert under pressure or "press-insert" it into a heated metal mold structure for mold-shaping processing.

Further in a solder ball attachment process, adhere or bond solder balls 4, which will later be used as external terminals, to the back surface of the substrate (at step S4). Lastly, at a substrate cutaway process step, cutting for separation is applied to a frame of the strip-like substrate 2 to thereby subdivide it into several separate packages (at step S5). Whereby, the intended BGA surface-mount type packages may be completed.

Figure 23:
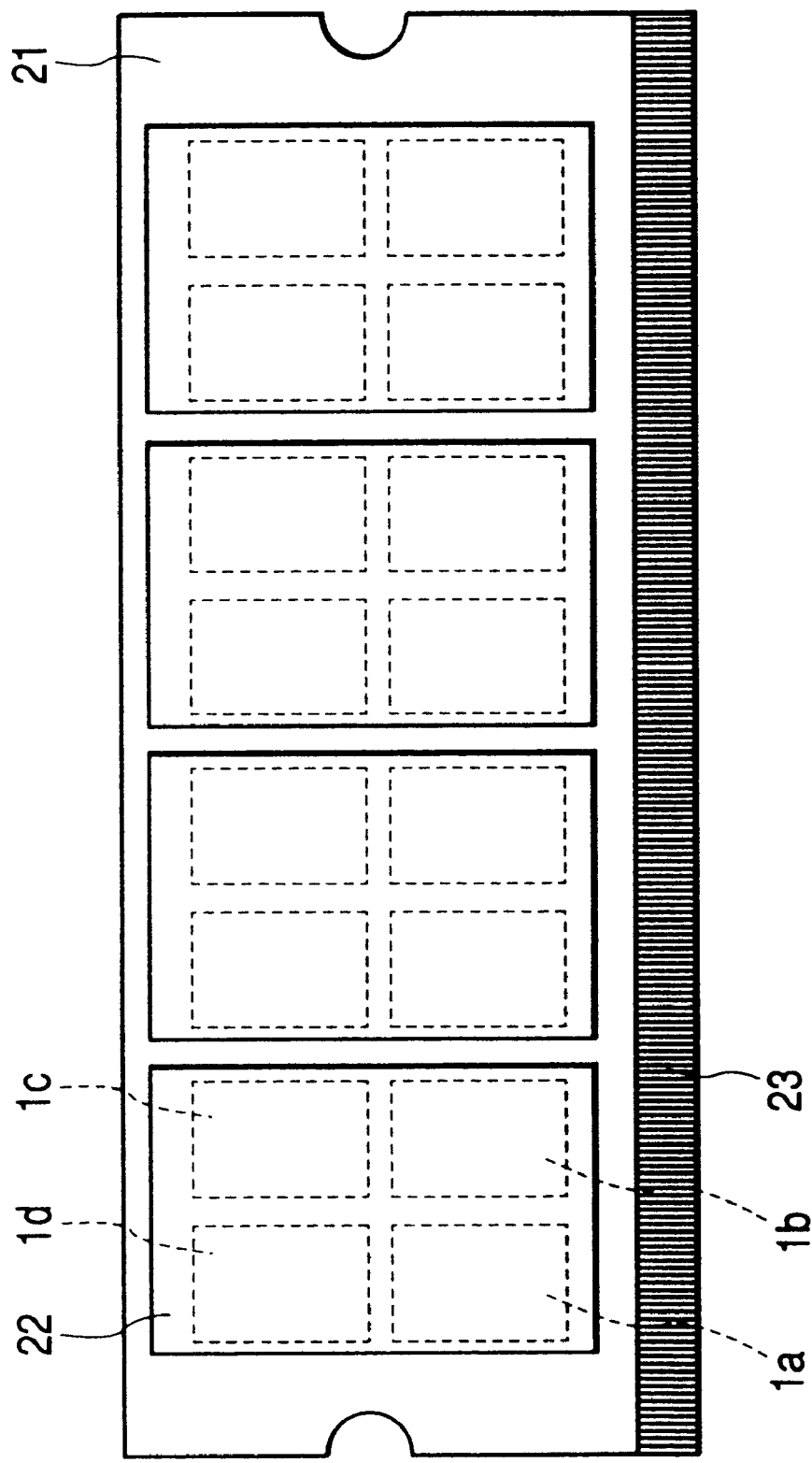
FIG. 23 is a plan view of a memory module in the embodiment 1 of the invention.
Figure 24:
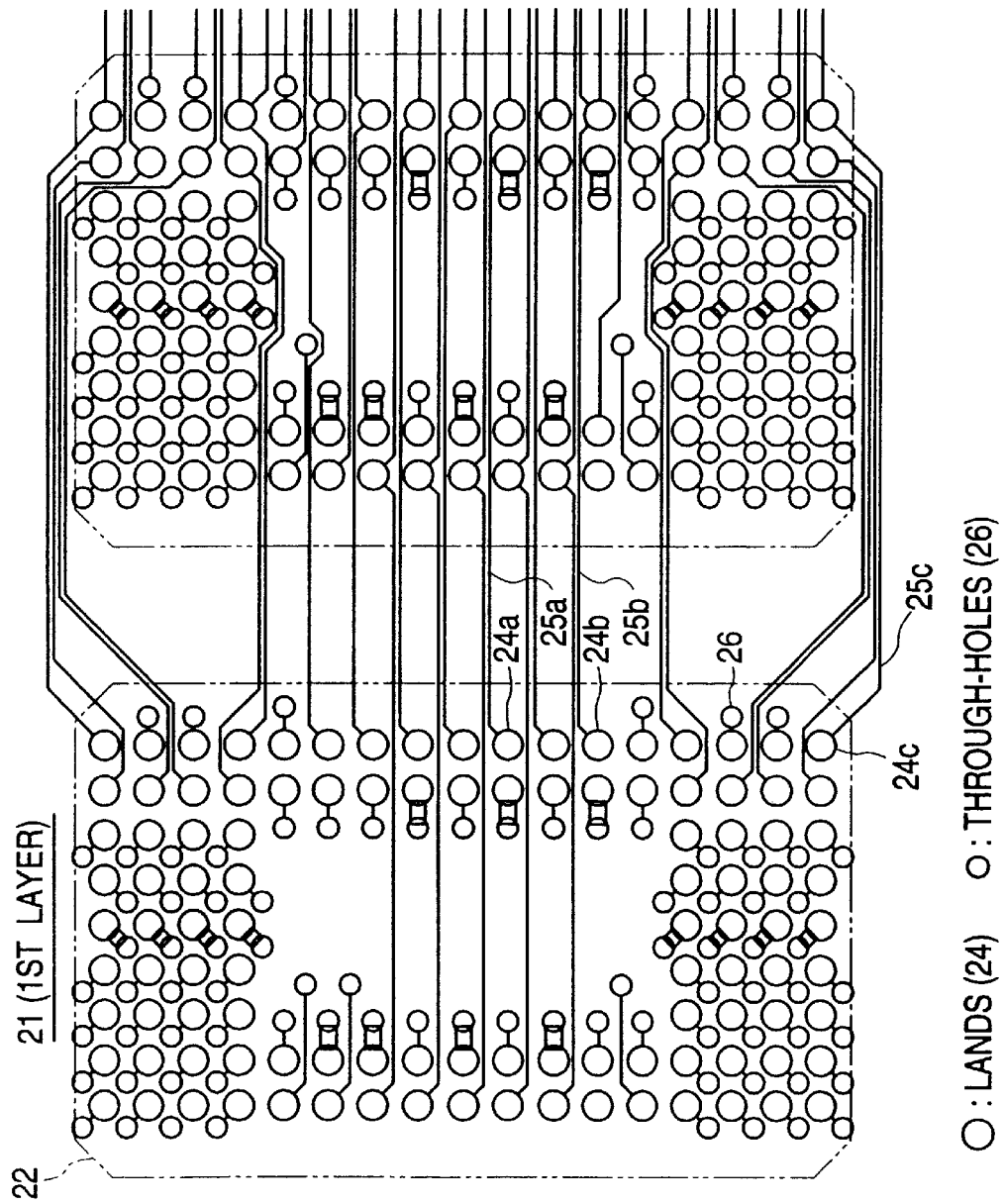
FIG. 24 is a plan view of a first-layer wiring pattern of a module substrate in the embodiment 1 of the invention.

An explanation will next be given of one exemplary memory module employing the BGA surface-mount type packages of this embodiment, in conjunction with FIGS. 23–26. FIG. 23 is a diagram showing a plan view of the memory module; FIGS. 24–26 are plan view diagrams showing wiring lead patterns of respective layer of a module board, wherein FIG. 24 shows a first layer, FIG. 25 shows a second layer, FIG. 26 shows a third layer, respectively.

FIG. 23 is an example of the small outline dual inline memory module (SODIMM), wherein four BGA surface-mount type packages 22 each having a planar rectangular shape are mounted on a substantially planarly rectangular module board 21, which are laid out to have a linear array along the long sides of the board. External connection terminals 23 are provided along one long side of this module board 21 on the both surfaces thereof. This SODIMM offers 1,024-Mbit memory capacity.

This SODIMM's module board 21 is designed to have a six-layer lamination structure by way of example, wherein three ones of such six layers are arranged as signal layers, the first layer of which is as shown in FIG. 24, the second one of which is shown in FIG. 25, and the third one of which is in FIG. 26. The three remaining layers of them are assigned for power supply use. It should be noted that although FIGS. 24–26 show lands 24 and wiring leads 25 plus through-holes 26 corresponding only to part of two BGA surface-mount type packages 22, additional leads corresponding to the other two BGA surface-mount type packages 22 are designed to extend in the rightward direction.

In FIGS. 24–26, an ensemble of addressing lands 24a of address signals and controlling lands 24b of control signals is collectively disposed on the center side in the short-side direction of the module board 21 in a way corresponding to each BGA surface-mount type package 22, wherein a lead pattern of parallel address wiring leads 25a and control leads 25b is led out and formed these respective lands 24a, 24b in the long-side direction of the module board 21. Similarly, from input/output lands 24c of input/output data as collectively disposed on the peripheral side in the short-side direction of the module board 21, a lead pattern of parallel input/output leads 25c is arranged in the long-side direction of the module board 21. In addition, through-holes 26 filled with conductive materials for electrical connection through each layer are laid out at those locations similar to the BGA surface-mount type packages 22, for example.

The SODIMM thus arranged as stated above is assembled as a memory module into various types of electrical devices such as for example computers, for use as a main storage unit for storing therein a large amount of data and the like.

Consequently, according to the BGA surface-mount type packages 22 of this embodiment, the following advantages are obtainable.

(1) By disposing the pads 9 on chips 1 in a way such that the address/control signal pads 9a–9b are laid out at the central part whereas input/output data's input/output pads 9c are at peripheral portions while letting the substrate 2 to have a four-layer lamination structure, it becomes possible to dispose on each layer of the substrate 2 a pattern of certain wiring leads 13, adjacent ones of which contact(touch) each other resulting in creation of interference; thus, it is possible to improve the degree of freedom or flexibility in railing leads for connection from the pads 9 on chips 1 via the substrate 2 to the solder balls 4.

(2) Disposing a group of address/control signal pads 12a, 12b on the substrate 2 and through-holes 10a, 10b and the like at the center part with respect to four chips 1 makes it possible to common use or "commonization" of leads 13a, 13b for use in connecting together these pads 12a, 12b and the through-holes 10a, 10b, thereby enabling, as in the said case, improvement in flexibility of railing leads for connection from the pads 9 on chips 1 via the substrate 2 to the solderer balls 4.

(3) Disposing the pads 12 on the substrate 2 in such a manner that they are divided into those lying at the central part among the chips 1 and the others at peripheral portions makes it possible to permit bonding processes of wires 3 from the pads 9 on chips 1 toward the pads 12 on substrate 2 to be done in away separately for the right side and the left side; thus, it becomes possible to make easier railing of electrical leads for use with the BGA surface-mount type packages 22.

(4) By having on the chips 1 and substrate 2 specific option-use pads 9f, 12f of bonding option functions capable of switching into a ×16 or ×8 input/output bit configuration to thereby permit switching of wire bonding, it is possible by using the same chips 1 and substrate 2 to achieve the intended BGA surface-mount type package(s) 22 of ×64 or ×32 input/output bit configuration.

(5) Providing more than one penetration hole 15 in the substrate 2 makes it possible, in case problems occur in reflow characteristics depending on combination of members, to allow moisture vapor occurring during thermal processing at solderer reflow process steps to successfully escape from the top surface side of the substrate 2 through such penetration hole 15 toward the bottom surface side thereof.

(6) Applying the first bonding to the pads 12 on the substrate 2 while performing the second bonding to the pads 9 on the chips 1 makes it possible to improve the distance margin between the chips 1 and the wires 3 in case the side edges of chips 1 are in close proximity in position to the pads 12 on the substrate 2 due to a limitation of the outer shape. In addition, as the wires 3 are forced to rise up on the side of such first bonding, it is possible by utilizing the height of the chips 1 to reduce the height of such wires 3 from the surface of the substrate 2.

(7) Prebonding gold balls 16 onto the pads 9 on the chips 1 and then applying the second bonding to portions overlying this gold ball 16 makes it possible to prevent damages to lead patterns on the chips 1.

(8) As the BGA surface-mount type packages 22 are each arranged so that the address/control signal solderer balls 4a–4b are centrally laid out whereas the input/output data solderer balls 4c are disposed at peripheral portions, it is possible by laterally disposing such BGA surface-mount type packages 22 to facilitate achievement of the module making procedure for manufacture of the intended memory module.

It should be noted here that although in said BGA surface-mount type packages 22 one specific example has been explained which comes with the pads 12 on the substrate 2 including two columns extending in the long-side direction and two rows on the both sides of peripheral portions, this arrangement may be modified in a way as shown in FIGS. 27–29 by way of example. Note that FIG. 27 shows only part at which two, upper and lower chips 1 are mounted whereas FIGS. 28–29 each show only part whereat a single chip 1 is mounted.

FIG. 27 is an example wherein the pads 12 on the substrate 2 are organized into several linear pad array or "columns" in such a manner that a single column is disposed at the center part in the long-side direction of the substrate 2 and that a couple of parallel pad columns is disposed at each of the both side peripheral portions while causing the single column at the center part to be designed so that pads 12 are disposed only at specified periphery in the long-side direction of the substrate 2. In this case, with regard to address signals and control signals, wires 3 will be tied from the pads 9 on the chips 1 to those pads 12 as disposed into two columns at the peripheral portions on the substrate 2, which will be effective in cases where the address signal transmission leads are substantially the same in lead length as the control signal transfer leads. Thus, it becomes possible to eliminate any possible time delay or time lag otherwise occurring between address signals or between control signals or alternatively between such both signals, thus enabling an operation to increase in stability.

FIG. 28 is an example wherein the pads 12 on the substrate 2 are organized into four linear pad array or "columns" in such a manner that a couple of parallel pad columns is disposed at each of the both side peripheral portions in the long-side direction of the substrate 2. In this case, wires 3 will be tied from the pads 9 on the chips 1 for address signals and control signals plus input/output data to those pads 12 as disposed into two columns at the peripheral portions on the substrate 2, which will be effective in cases where no space is present at the center part in the long-side direction of the substrate 2.

FIG. 29 is a modified example of that shown in FIG. 28, which will be effective in case space is available between the upper side and the lower side along the long-side direction of the substrate 2 and also at the upper and lower side edge portions.

Embodiment 2

Figure 30:
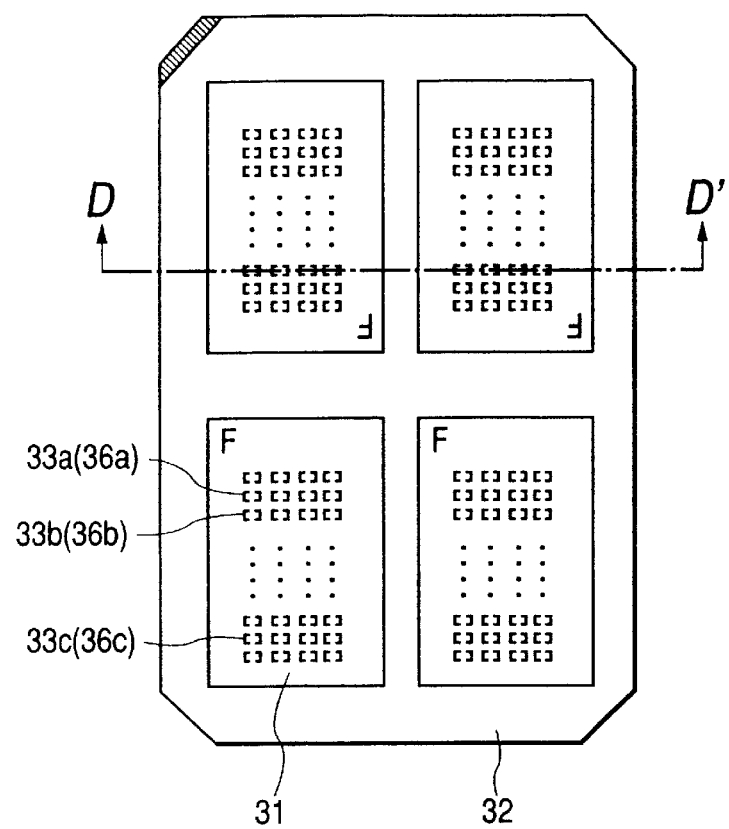
FIG. 30 is a diagram schematically showing a plan view of a structure including a substrate mounting chips thereon in accordance with an embodiment 2 of the instant invention.
Figure 31:
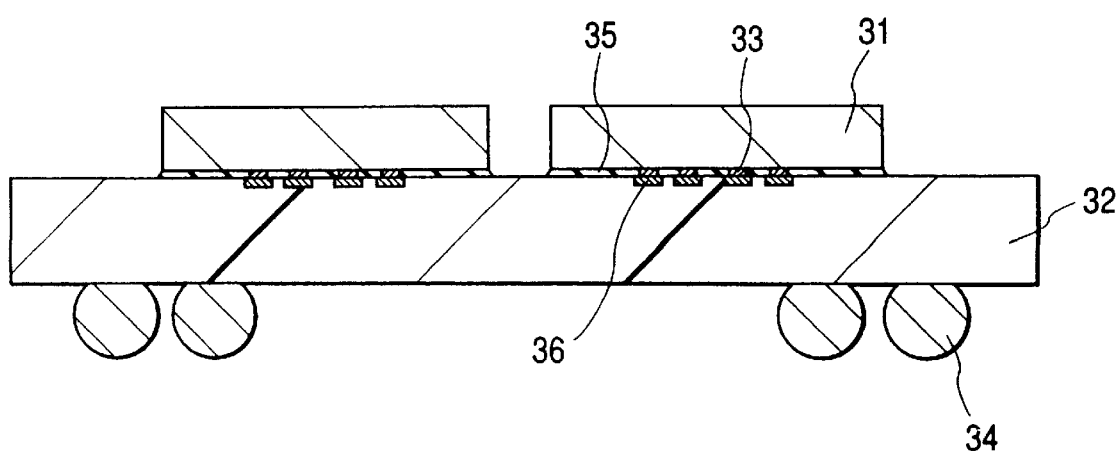
FIG. 31 is a cross-sectional view of the semiconductor device of FIG. 30 as taken along line D–D' in the embodiment 2 of the invention.

FIGS. 30–31 are drawings for explanation of a semiconductor device which is an embodiment 2 of the present invention. FIG. 30 is a schematical plan view diagram in the state that chips are mounted on a substrate, and FIG. 31 depicts a cross-sectional view of the structure shown in FIG. 30 as taken along line D–D'.

The semiconductor device of the illustrative embodiment is arranged as a BGA surface—mount type package in a way similar to that of said embodiment 1, wherein the former is different from the latter in chip mount structure-that is, this embodiment is designed to employ a specific structure which is such that the chips are mounted on the substrate by use of a face-down structure, wherein the chips and the substrate are flip-chip bonded together by metal balls with a resin material being filled in a space between surfaces of the chips mounted on the substrate and the substrate.

More specifically, as shown in FIG. 31, the BGA surface-mount type package of this embodiment is generally configured from four chips 31 each with a memory circuit formed thereon, a substrate 32 mounting thereon these four chips 31, solderer bumps 33 for use in connecting this substrate 32 and chips 31 together, solderer balls 34 provided on the back surface of the substrate 32, a protective material 35 for protection of surfaces of the chips 31 as mounted on substrate 32, and others. This structure is substantially the same as said embodiment 1 except that the solderer bumps 33 are bonded to chips 31 in the alternative of bonding pads while providing lands 36 on the substrate 32 due to the fact that the surfaces of chips 31 become the side of the substrate 32.

As in said embodiment 1, the embodiment shown herein is also arranged so that four chips 31 each having a substantially rectangular planar shape are mounted on the substrate 32 of a substantially rectangular planar shape in such a manner that these chips are disposed in a matrix of two rows and two columns on the substrate surface, as shown in FIG. 30. This matrix array of these four chips 31 may include an upper pair of chips and a lower chip pair, which are laid out in linear symmetry with respect to the center line extending in the long-side direction of the substrate 32.

In addition, the solderer bumps 33 are laid out on the surface of each chip 31 in the form of a matrix including a plurality of columns, e.g. four columns. These plurality of solderer bumps 33 are disposed so that address-use solderer bumps 33a of address signals and controlling solderer bumps 33b of control signals are placed on the center side in the long-side direction of the substrate 32 for common use or "commonization" of such address signals and control signals. On the other hand, input/output solderer bums 33c of input/output data are disposed so that they are located on the peripheral side in the long-side direction of the substrate 32.

Further, respective lands 36 on the substrate 32 are arranged similarly to the solderer bumps 33 on the chips 31 in such a manner that addressing lands 36a of address signals and control lands 36b of control signals are disposed on the center side in the long-side direction of the substrate 32 whereas input/output lands 36c of input/output data are laid out on the peripheral side in the long-side direction of the substrate 32.

Accordingly, with the BGA surface-mount type package of this embodiment, it is possible to obtain similar advantages to those of said embodiment 1 while at the same time enabling the package to decrease in size as compared to said embodiment 1 because of the fact that the solderer bumps 33 of the chips 31 are disposed in the form of a matrix array including a plurality of columns while designing the substrate 32 so that it does not require any space around such chips 31 thereby avoiding the need to appreciably make larger the chips 31 and substrate 32.

Embodiment 3

Figure 32:
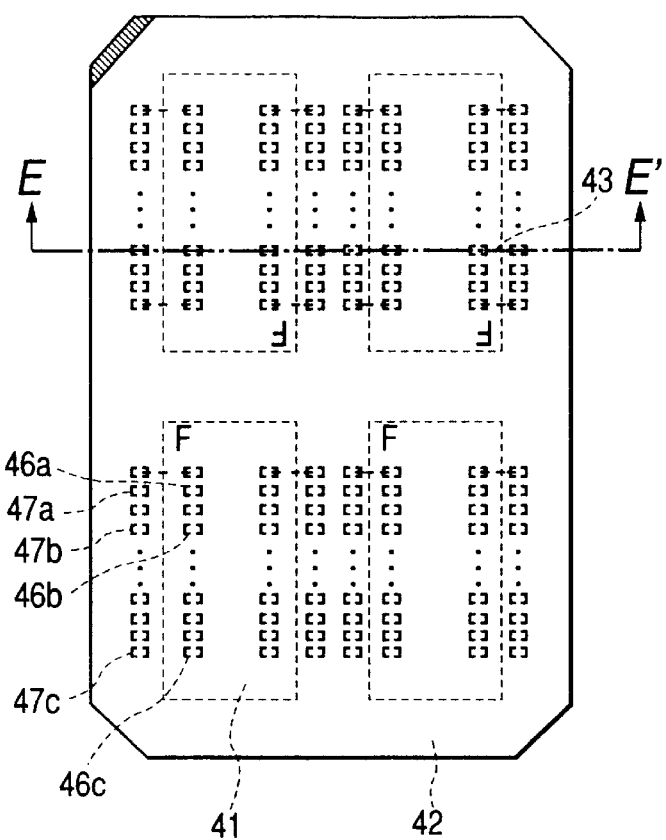
FIG. 32 is a diagram schematically showing a plan view of a structure including a substrate mounting chips thereon in accordance with an embodiment 3 of the invention.
Figure 33:
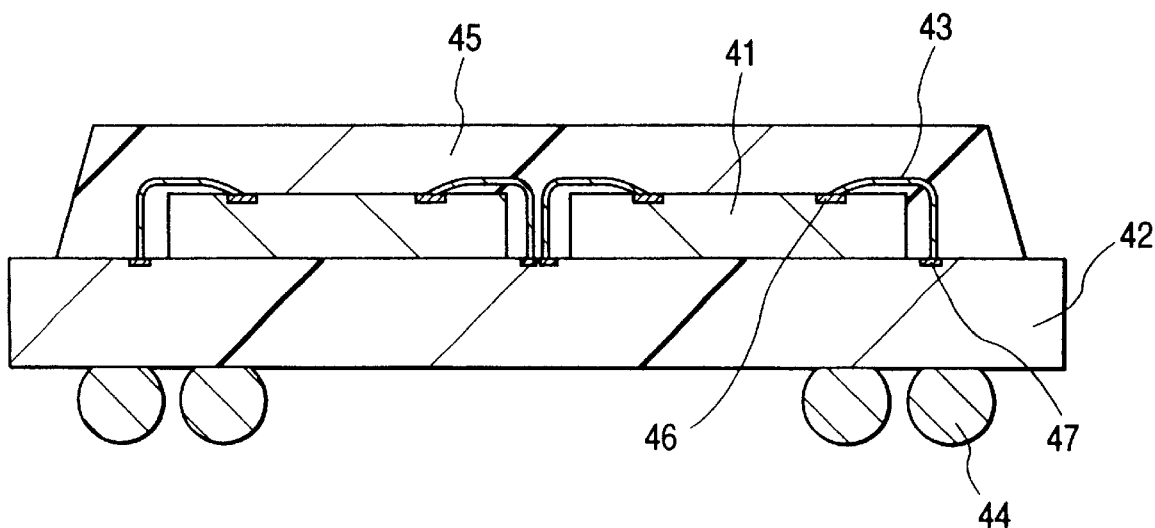
FIG. 33 is a sectional view of the semiconductor device of FIG. 32 as taken along line E–E' in the embodiment 3 of the invention.

FIGS. 32–33 are drawings for explanation of a semiconductor device in accordance with an embodiment 3 of the present invention. FIG. 32 is a schematical plan view diagram in the state that chips are mounted on a substrate, and FIG. 33 shows a sectional view of the structure of FIG. 32 as taken along line E–E'.

The semiconductor device of this embodiment is arranged as a BGA surface-mount type package in the same way as in said embodiment 1, wherein the former is different from the latter in pad layout on chips—that is, this embodiment is designed to employ the so-called peripheral pad layout structure with on-chip pads disposed along the opposite sides at peripheral portions of neighboring chips.

More specifically, as shown in FIG. 33, the BGA surface-mount type package of this embodiment is generally configured from four chips 41 each with a memory circuit formed thereon, a substrate 42 mounting thereon these four chips 41, wires 43 for use in connecting together pads on this substrate 42 and pads on the chips 41, solderer balls 44 provided on the back surface of the substrate 42, a sealing material 45 for molding the chips 41 as mounted on substrate 42 and the wires 43, and the like. This structure is substantially the same as said embodiment 1 except that pads 46 on chips 41 are disposed along the opposite sides in the long-side direction.

As in said embodiment 1, the embodiment shown herein is also designed so that four chips 41 each having a substantially rectangular planar shape are mounted on the substrate 42 of a substantially rectangular planar shape in such a manner that these chips are disposed in a matrix of two rows and two columns on the substrate surface, as shown in FIG. 32. This matrix array of these four chips 41 includes an upper pair of chips and a lower chip pair, which are laid out in linear symmetry with respect to the center line extending in the long-side direction of the substrate 42.

In addition, the plurality of pads 46 are laid out on the surface of each chip 41 along the opposite sides in the long-side direction. These pads 46 are disposed so that address-use solderer bumps 46a of address signals and controlling pads 46b of control signals are placed on the center side in the long-side direction of the substrate 42 for common use or "commonization" of such address signals and control signals. On the other hand, input/output pads 46c of input/output data are disposed so that they are located on the other side along the opposing side on each chip 41—i.e. on the peripheral side in the long-side direction of the substrate 42.

Further, respective pads 47 on the substrate 42 are arranged similarly to the pads 46 on the chips 41 in such a manner that addressing pads 47a of address signals and control lands 47b of control signals are disposed on the center side in the long-side direction of the substrate 42 whereas input/output pads 47c of input/output data are laid out on the peripheral side in the long-side direction of the substrate 42.

Accordingly, with the BGA surface-mount type package of this embodiment, it is possible to obtain similar advantages to those of said embodiment 1 while simultaneously enabling the package to decrease in size as compared to said embodiment 1 because of the fact that the pads 46 of the chips 41 are disposed along the opposite sides thereby avoiding the need to appreciably make larger the chips 41.

It must be noted that the chips 41 of said peripheral pad layout structure may be modified to have what is called the "mirror chip" wherein the pads 46 as disposed along the opposite sides are inverted in function assignment. This mirror chip will be effective in cases where signal transfer lines are made equal in lead length.

Although the invention as made by the present inventors as named herein has been practically explained on the basis of several embodiments thereof, the present invention should not be limited only to such embodiments and may be freely modified and altered into a variety of forms without departing from the true spirit and scope of the invention.

For example, said embodiments stated supra are arranged to exemplarily employ the BGA surface-mount type package (s); however, the principal concepts of the invention may also be applied without any significant alteration to other packaging structures with external terminals disposed on the back surface of a substrate, including but not limited to land grid array (LGA), chip size package (CSP), and other similar suitable structures.

In addition, the requisite number of those chips mounted on the substrate should not be limited only to four—in cases where two, three or five or more chips are to be mounted thereon, similar effects and advantages may be obtained by taking into consideration the layout of address signals and control signals plus input/output data in the way discussed in conjunction with said embodiments.

Further, the circuitry as formed on the chips should not be limited only to the SDRAM, and obviously the invention may also be applied to other memory circuits, including DRAMs, SRAMS, etc.

Furthermore, the substrate should not be limited only to the four-layer lamination structure and may alternatively be designed to have a lamination structure of five or more layers; still further, a tape of multilayer structure is employable which includes metal thin-films made of copper (Cu) on a respective one of tape-shaped layers made of resin materials such as polyimide. In the case of this tape substrate used, such substrate may be wound for processing into a reel-like shape at assembly process steps.

Moreover, the function assignment of those connection terminals of address signals and control signals plus input/output data as disposed on the substrate should not be limited to said one as shown in the drawings; detailed assignment is modifiable in each of an ensemble of address/control signals laid out to place on the center side of the substrate and a collection of input/output data disposed on the peripheral side of the substrate.

Additionally, while the present invention is effectively adaptable for use in memory packages mounting a plurality of chips each with memory circuitry formed thereon, the invention may also be applied to other semiconductor devices such as system LSIs with different types of chips mounted together in combination in a single package, including but not limited to a microprocessor or microcomputer chip and multiple data storage circuit chips operatively associated therewith.

Advantages of the Invention

Several effects and advantages obtainable by the representative ones of the inventions as disclosed herein are as follows.

(1) It becomes possible to improve the degree of freedom or flexibility of railing those wiring leads for use in connection from respective chips via a substrate up to external terminals because it is possible to collectively dispose address leads on the center side of the substrate, by specifically arranging four separate chips on the substrate in the form of a matrix consisting of rows and columns in such a manner that one of a pair of short sides of each chip is laid out adjacent to a corresponding one of a pair of short sides of its neighboring chip to ensure that respective addressing pads of each chip are placed on the center side on the plane of such substrate while permitting corresponding pads in respective address pads of respective chips to be commonly coupled together to an external terminal.

(2) By employing a specific arrangement wherein the substrate is of a multilayer lamination structure having wiring leads in a plurality of layers while providing a first lead layer extending in the short-side direction of the substrate for electrically separating or insulating between those address pads of certain chips as disposed in the short-side direction of the substrate and also providing a second lead layer different from the first lead layer and extending in the long-side direction of the substrate for electrically insulating between address pads of specified chips as disposed in the long-side direction of the substrate with each layer being electrically connected by more than one through-hole filled with a conductive material, it is possible to dispose on each layer of the substrate a railing pattern of certain wiring leads adjacent ones of which can contact each other in the planar direction resulting in occurrence of interference; accordingly, in combination with said (1) it becomes possible to improve the flexibility of arranging those wiring leads for connection from respective chips via a substrate up to external terminals.

(3) Disposing the pads on the substrate along outside of a pair of long sides of each chip makes it possible to perform bonding processes of bonding wires from the pads on each chip to the pads on the substrate in a way such that to-be-bonded portions are distributed between the right side and left side, which in turn makes it possible to readily perform the intended railing of leads during wire bonding processes.

(4) Forming more than one penetration hole or aperture in the substrate makes it possible for moisture vapor occurring due to thermal processing at solderer-reflow process steps to successfully escape from the top surface side of the substrate toward the bottom or back surface side thereof in cases where problems occur in reflow characteristics in combination of members used.

(5) Applying the first bonding to the pads on the substrate while applying the second bonding to the pads on the chips makes it possible to improve the distance margin between the chips and the bonding wires in the event that the lateral sides of such chips are in close proximity in position to the pads on the substrate due to a limitation to external shape.

(6) Forcing the bonding wires to rise up on the first bonding side makes it possible to reduce by utilizing the height of chip the height of such bonding wires as measured from the surface of the substrate.

(7) Forming metal balls on the pads on chips for permitting the second bonding to be applied to such metal balls makes it possible to prevent damages to electrical lead patterns on such chips.

(8) By specifically designing respective chip and the substrate supporting them thereon so that these are respectively arranged to have option-use pads with bonding option functionalities capable of switching between ×16 and ×8 input/output bit configurations, it is possible to permit each chip to offer ×16 or ×8 input/output bit configuration through changeover of the bonding of those option-use pads on each chip and the substrate, which in turn makes it possible by using the same chips and substrate to arrange the intended ×64 or ×32 input/output bit configuration.

(9) Letting the address terminals of the external terminals be laid out at the center part of a pair of long sides of the substrate while disposing input/output terminals at the corners thereof makes it possible, in case a module arrangement is required, to dispose packages into a lateral array, which in turn enables facilitation of "moduling" resign activities.

(10) Due to said (1) to (9), when one-packaging of a plurality of chips, it becomes possible to achieve the intended semiconductor device suitable for use in accommodating the quest for larger capacities, by mounting four separate chips on a substrate in the form of a 2D matrix of two rows and two columns in the planar direction.

What is claimed is:

1. A semiconductor device comprising four chips each having on its surface a memory circuit and a plurality of pads including a plurality of address pads for use in inputting address signals of said memory circuit along with a plurality of input/output pads for inputting and outputting input/output data and also having a pair of long sides and a pair of short sides, a substrate supporting thereon said four chips and having on its surface a plurality of pads including address pads and input/output pads as electrically connected to respective ones of the address pads and input/output pads of said four chips, and a plurality of external terminals being electrically connected to the address pads and input/output pads on said substrate and including address terminals and input/output terminals as provided on a bottom surface of said substrate, said four chips are each such that said input/output pads are of ×16 input/output bit configuration, corresponding pads in respective plurality of address pads of each of said four chips are connected in common to said address terminals of said external terminals, and the plurality of input/output pads of each of said four chips are connected to said input/output terminals of said external terminals in a way independent per each chip and are thus caused by said four chips to have ×64 input/output bit configuration, wherein said substrate is of a polygonal shape having a pair of long sides and a pair of short sides, said substrate has a multilayered wiring lead structure with electrical leads of a plurality of layers, said four chips are laid out into a matrix of two rows in a direction along the short sides of said substrate and two columns in a long side direction, address pads of chips laid out in the short side direction of said substrate are electrically connected together by a first lead layer extending in the short side direction of said substrate, and address pads of chips laid out in the long side direction of said substrate are electrically connected together by a second lead layer being different from said first lead layer and extending in the long side direction of said substrate.

* * * * *